US012199124B2

(12) United States Patent
Tomekawa et al.

(10) Patent No.: US 12,199,124 B2
(45) Date of Patent: Jan. 14, 2025

(54) IMAGING DEVICE

(71) Applicant: Panasonic Intellectual Property Management Co., Ltd., Osaka (JP)

(72) Inventors: Yuuko Tomekawa, Osaka (JP); Yoshihiro Sato, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 511 days.

(21) Appl. No.: 17/493,923

(22) Filed: Oct. 5, 2021

(65) Prior Publication Data

US 2022/0028916 A1 Jan. 27, 2022

Related U.S. Application Data

(63) Continuation of application No. PCT/JP2020/028642, filed on Jul. 27, 2020.

(30) Foreign Application Priority Data

Sep. 4, 2019 (JP) .................................. 2019-161613

(51) Int. Cl.
*H01L 27/146* (2006.01)

(52) U.S. Cl.
CPC .... *H01L 27/14636* (2013.01); *H01L 27/1461* (2013.01); *H01L 27/1464* (2013.01); *H01L 27/14643* (2013.01)

(58) Field of Classification Search
CPC ........... H01L 27/14636; H01L 27/1461; H01L 27/1464; H01L 27/14643; H01L 27/14612;

(Continued)

(56) References Cited

U.S. PATENT DOCUMENTS

2002/0117690 A1 8/2002 Rhodes
2007/0296085 A1 12/2007 Coolbaugh et al.
(Continued)

FOREIGN PATENT DOCUMENTS

JP 2008-004939 1/2008
JP 2018-195803 12/2018
(Continued)

OTHER PUBLICATIONS

International Search Report of PCT application No. PCT/JP2020/028642 dated Oct. 13, 2020.

*Primary Examiner* — Herve-Louis Y Assouman
*Assistant Examiner* — Linda J. Fleck
(74) *Attorney, Agent, or Firm* — Rimon P.C.

(57) ABSTRACT

An imaging device includes a semiconductor substrate and pixels. Each of the pixels includes a first capacitive element including a first electrode provided above the semiconductor substrate, a second electrode provided above the semiconductor substrate, and a dielectric layer located between the first electrode and the second electrode. At least one selected from the group consisting of the first electrode and the second electrode has a first electrical contact point electrically connected to a first electrical element and a second electrical contact point electrically connected to a second electrical element different from the first electrical element. The first capacitive element includes at least one trench portion having a trench shape.

18 Claims, 18 Drawing Sheets

(58) Field of Classification Search
CPC ......... H01L 27/14638; H01L 27/14665; H01L 27/14603; H01L 28/40; H04N 23/54; H04N 23/76
See application file for complete search history.

(56) References Cited

U.S. PATENT DOCUMENTS

| | | | |
|---|---|---|---|
| 2008/0124886 A1* | 5/2008 | Lin | H10B 12/0335 438/653 |
| 2008/0232025 A1 | 9/2008 | Coolbaugh et al. | |
| 2014/0110823 A1* | 4/2014 | Chou | H01L 29/945 257/532 |
| 2016/0190188 A1* | 6/2016 | Murakami | H01L 27/14609 250/214 A |
| 2018/0331140 A1 | 11/2018 | Sato | |
| 2019/0027524 A1* | 1/2019 | Sato | H01L 27/14612 |
| 2019/0043903 A1* | 2/2019 | Gambino | H01L 27/14609 |
| 2019/0081096 A1 | 3/2019 | Tomekawa et al. | |
| 2019/0166319 A1* | 5/2019 | Sato | H01L 27/14612 |
| 2019/0181178 A1 | 6/2019 | Takase et al. | |
| 2019/0252488 A1 | 8/2019 | Koyanagi et al. | |
| 2021/0057469 A1* | 2/2021 | Huang | H01L 28/92 |
| 2022/0321794 A1* | 10/2022 | Yoneda | H01L 27/146 |

FOREIGN PATENT DOCUMENTS

| | | |
|---|---|---|
| JP | 2019-054238 | 4/2019 |
| JP | 2019-106534 | 6/2019 |
| JP | 2019-145790 | 8/2019 |

* cited by examiner

IMAGING DEVICE

BACKGROUND

1. Technical Field

The present disclosure relates to an imaging device,

2. Description of the Related Art

An image capture device has been proposed that has a structure in which a photoelectric conversion layer is arranged at an upper side of a semiconductor substrate at which a charge-coupled device (CCD) circuit or a complementary metal-oxide semiconductor (CMOS) circuit is formed. The image capture device that has the photoelectric conversion layer at the upper side of the semiconductor substrate is called a laminate-type image capture device. For example, a solid-state imaging device having such a laminate-type structure is disclosed in Japanese Unexamined Patent Application Publication No. 2018-195803.

In the laminate-type image capture device, charge generated by photoelectric conversion is accumulated in a charge accumulation region, and a readout circuit including a CCD circuit or a CMOS circuit reads out the accumulated charge. The photoelectric conversion layer is generally arranged on an insulating layer that covers a semiconductor substrate in which the readout circuit is formed. The photoelectric conversion layer on the insulating layer is electrically connected to the readout circuit via a connection portion provided in the insulating layer.

SUMMARY

In one general aspect, the techniques disclosed here feature an imaging device including a semiconductor substrate and pixels. Each of the pixels includes a first capacitive element including a first electrode provided above the semiconductor substrate, a second electrode provided above the semiconductor substrate, and a dielectric layer located between the first electrode and the second electrode. At least one selected from the group consisting of the first electrode and the second electrode has a first electrical contact point electrically connected to a first electrical element and a second electrical contact point electrically connected to a second electrical element different from the first electrical element. The first capacitive element includes at least one trench portion having a trench shape.

It should be noted that general or specific embodiments may be implemented as an element, a device, a system, an integrated circuit, or a method or may be implemented as an arbitrary combination of an element, a device, an apparatus, a system, an integrated circuit, and a method.

Additional benefits and advantages of the disclosed embodiments MI become apparent from the specification and drawings. The benefits and/or advantages may be individually obtained by the various embodiments and features of the specification and drawings, which need not all be provided in order to obtain one or more of such benefits and/or advantages.

Figure 1:
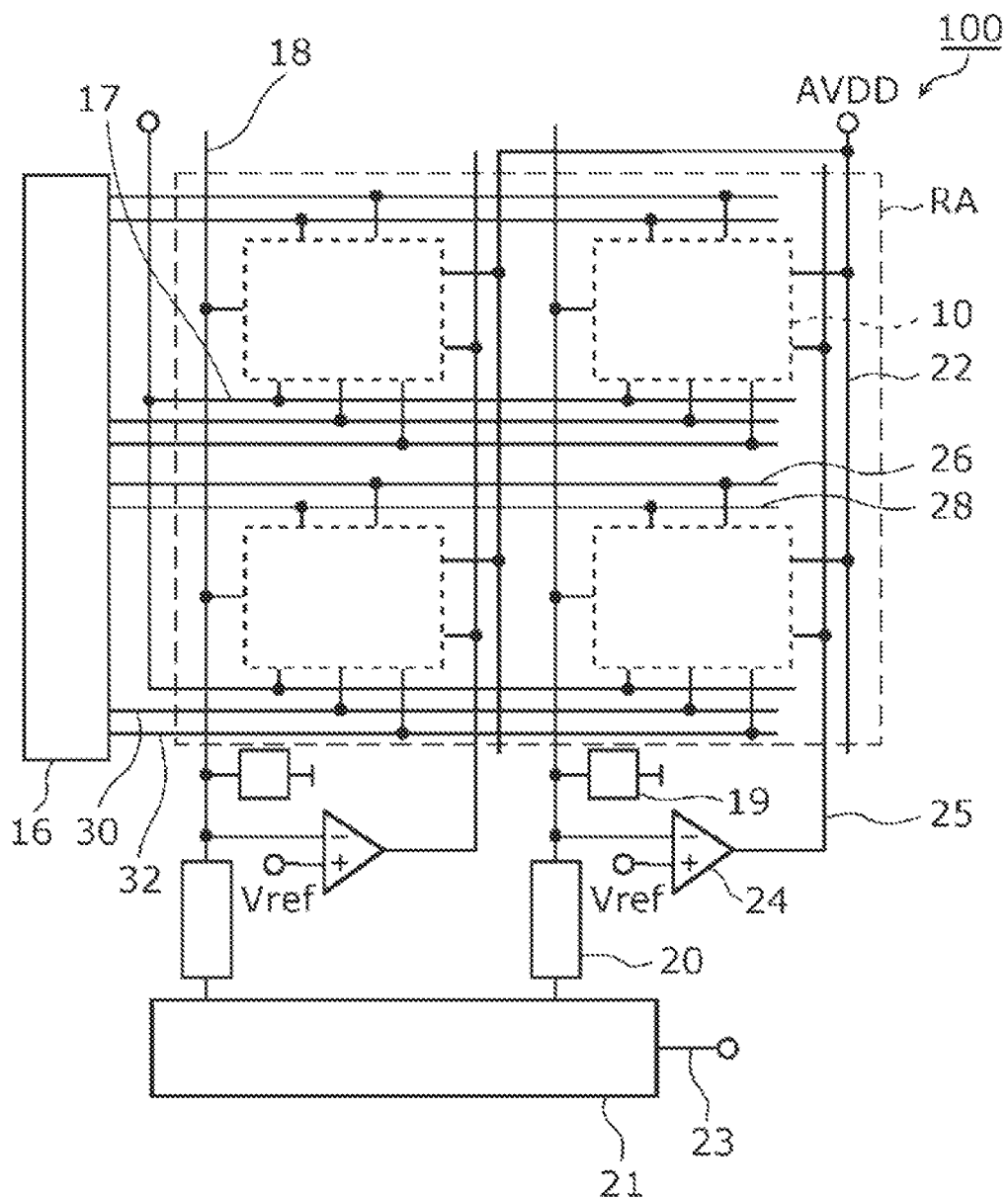
FIG. 1 is a diagram showing an exemplary circuit configuration of an imaging device according to a first embodiment.

DETAILED DESCRIPTION (Overview of the Present Disclosure)

Non-limiting and exemplary embodiments of the present disclosure provides the followings.

An imaging device according to one aspect of the present disclosure includes a semiconductor substrate and pixels. Each of the pixels includes a first capacitive element including a first electrode provided above the semiconductor substrate, a second electrode provided above the semiconductor substrate, and a dielectric layer located between the first electrode and the second electrode. At least one selected from the group consisting of the first electrode and the second electrode has a first electrical contact point electrically connected to a first electrical element and a second electrical contact point electrically connected to a second electrical element different from the first electrical element. The first capacitive element includes at least one trench portion having a trench shape.

Thus, since the first capacitive element is provided with two or more electrical contact points, it is possible to increase the degree of freedom of a layout of wires that provide electrical connection between the first capacitive element and the electrical elements. Thus, for example, since wires can be provided so that a parasitic capacitance between wires becomes less likely to occur even in a small pixel region, noise can be reduced. Thus, it is possible to realize an imaging device that can further reduce noise. Also, since an increase in the degree of freedom of the layout of the wires can reduce the pixel area, the imaging device is miniaturized.

For example, at least one selected from the group consisting of the first electrical contact point and the second electrical contact point may be provided at the at least one trench portion. For example, the at least one selected from the group consisting of the first electrical contact point and the second electrical contact point may be provided at a bottom surface of the at least one trench portion. For example, the first electrical contact point may be provided at the at least one trench portion, and the second electrical contact point may be provided at a portion other than the at least one trench portion.

As described above, the bottom surface or a side surface of the trench portion can be used to establish electrical connection with the electrical elements. That is, since the electrical contact points can be provided not only at a planar portion of the first capacitive element but also at a portion other than the planar portion, it is possible to enhance the degree of freedom of the wire layout.

For example, the at least one trench portion may include a plurality of trench portions, and the plurality of trench portions may include a trench portion where the first electrical contact point and the second electrical contact point are not provided.

This makes it possible to increase the capacitance value of the first capacitive element, while suppressing an increase in the area occupied by the first capacitive element in a plan view. That is, the first capacitive element having a large capacitance value can be provided in a small pixel area.

For example, the first electrode may be closer to the semiconductor substrate than the second electrode and may have the first electrical contact point and the second electrical contact point.

With this arrangement, for example, vias or exposed portions of wiring portions can be exposed to plasma during formation of trenches, and the exposed portions can be activated. When the exposed portions and the first electrode of the first capacitive element are connected at the contact points, it is possible to reduce the contact resistance between the vias or the wiring portions and the first electrode. A reduction in the contact resistance can reduce variations in contact resistances among the pixels, thus making it possible to suppress roughness in an image generated by the imaging device. Thus, it is possible to realize an imaging device that can further reduce noise.

For example, the second electrode may be farther from the semiconductor substrate than the first electrode and may have the first electrical contact point and the second electrical contact point.

With this arrangement, since the electrode provided with the electrical contact points is not limited to the first electrode, it is possible to further enhance the degree of freedom of the wire layout.

For example, the first electrode and the second electrode may contain titanium nitride (TiN) or tantalum nitride (TaN).

This makes it possible to form a first electrode and a second electrode having low surface roughness. Accordingly, since variations in the distance between the first electrode and the second electrode are suppressed, it is also possible to suppress variations in the capacitance value of the first capacitive element.

For example, the imaging device according to one aspect of the present disclosure may further include a plurality of wiring layers provided at an upper side of the semiconductor substrate. Of the plurality of wiring layers, the number of wiring layers located at an upper side of the first capacitive element may be larger than the number of wiring layers located at a lower side of the first capacitive element.

In many cases, impurity regions that serve as parts of photoelectric converters for accumulating signal charge generated by charge accumulation portions are formed at a semiconductor substrate. Since the number of wiring layers that are close to the semiconductor substrate can be reduced, it is possible to suppress variations in the potentials of the charge accumulation portions, the variations being caused by parasitic capacitance components in the wiring layers. Accordingly, it is possible to realize an imaging device that can further reduce noise.

For example, the imaging device may further include vias, and each of the first electrical contact point and the second electrical contact point may be connected to a corresponding one of the vias.

With this arrangement, for example, when upper ends of the vias are exposed to plasma during formation of the trenches, the upper ends of the vias are activated. This facilitates metal coupling between the upper ends of the vias and the electrodes of the first capacitive element, thus making it possible to reduce contact resistances between the vies and the electrodes of the first capacitive element.

For example, each of the pixels may further include: a photoelectric converter that converts light into charge; and an impurity region that is provided in the semiconductor substrate, the impurity region being electrically connected to the photoelectric converter. The charge may be accumulated in the impurity region. In a plan view, the first capacitive element may overlap the entire impurity region.

With this arrangement, when the first electrode or the second electrode is formed using material having a light-shielding property, the first capacitive element can suppress light incident on the imaging device reaching the impurity region. Thus, it is possible to suppress generation of unwanted charge in the impurity region, thus making it possible to further reduce noise.

For example, each of the pixels may further include: a photoelectric converter that converts light into charge; an impurity region that is provided in the semiconductor substrate, the impurity region being electrically connected to the photoelectric converter; a transistor electrically connected to the impurity region; and a second capacitive element. The charge may be accumulated in the impurity region. The transistor may be one of the first electrical contact point and the second electrical contact point, and the second capacitive element may be the other of the first electrical contact point and the second electrical contact point. For example, the transistor may be a reset transistor that resets the charge.

Thus, the first electrode or the second electrode can be made to have the same potential as the potential of one electrode of the second capacitive element and the potential of a source region or a drain region of the transistor. For example, the first electrode or the second electrode, one electrode of the second capacitive element, and the source region or the drain region of the transistor can be utilized as reset drain nodes.

For example, the second capacitive element may be electrically connected to the impurity region via the first electrode or the second electrode.

Thus, the first electrode or the second electrode of the first capacitive element can be utilized as a part of a wire. Thus, since a dedicated wire that is needed for electrical connection can be reduced, the space in each pixel can be increased, thus making it possible to further increase the degree of freedom of layout of other wires.

For example, each of the pixels may further include: a photoelectric converter that converts light into charge; and an impurity region that is provided in the semiconductor substrate, the impurity region being electrically connected to the photoelectric converter. The charge may be accumulated in the impurity region. The first electrode may be closer to the semiconductor substrate than the second electrode and may be electrically connected to the impurity region. The second electrode may be electrically connected to a pad to which a predetermined voltage value is applied.

This allows the potential of the first capacitive element to be adjusted with the voltage applied to the pad.

For example, the imaging device may further include a sensitivity adjustment line for adjusting sensitivity of the imaging device, the sensitivity adjustment line being electrically connected to the pad and the second electrode.

This allows the sensitivity to be adjusted according to the amount of light that is incident on the imaging device, and thus the dynamic range of the imaging device can be increased ranging from dark scenes to bright scenes.

For example, the imaging device may further include a signal line that is connected to the pixels. A potential of the signal line may vary with time. Each of the pixels may further include an impurity region that is provided in the semiconductor substrate. Charge generated by photoelectric conversion may be accumulated in the impurity region. The at least one trench portion may be located between the impurity region and the signal line and on a line that connects the impurity region and at least a part of the signal line. For example, the imaging device may further include a signal line that is connected to the pixels. A potential of the signal line may vary with time. Each of the pixels may further include a photoelectric converter that converts light into charge, a first via that connects the semiconductor substrate and the photoelectric converter, and a second via that connects the signal line and the semiconductor substrate. The at least one trench portion may be located between the first via and the second via and on a line that connects the first via and the second via. For example, the imaging device may further include a signal line that is connected to the pixels. A potential of the signal line may vary with time. Each of the pixels may further include a second via that connects the signal line and the semiconductor substrate. In a plan view, the first capacitive element does not necessarily have to overlap the second via.

For example, each of the pixels may further include a photoelectric converter that converts light into charge, and a first via that connects the semiconductor substrate and the photoelectric. The at least one trench portion may include a first trench portion and a second trench portion. In a sectional view, the first via is located between the first trench portion and the second trench portion. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Embodiments will be described below in detail with reference to the accompanying drawings.

The embodiments described below each present a general or specific example. Numerical values, shapes, materials, constituent elements, the arrangement positions and connection forms of constituent elements, steps, the order of steps, and so on described in the embodiments below are merely examples and are not intended to limit the present disclosure. Also, of the constituent elements in the embodiments below, constituent elements not set h in the independent claim will be described as optional constituent elements.

Also, the drawings are schematic diagrams and are not necessarily strictly illustrated. Accordingly, for example, scales and so on do not necessarily match in each drawing. In the individual drawings, substantially the same constituent elements are denoted by the same reference numerals, and redundant descriptions are omitted or are briefly given.

Also, herein, the terms "parallel", "orthogonal", and so on representing relationships between elements, terms representing element shapes, and the ranges of numerical values are not expressions representing only exact meanings and are expressions representing substantially equivalent ranges, for example, expressions meaning that they include differences of about several percent.

Also, herein, the terms "upper side", "top", and "upper" and the terms "lower side", "bottom", and "lower" do not refer to an upper direction (a vertically upper side) and a lower direction (a vertically lower side) in absolute spatial recognition and are used as terms defined by relative positional relationships based on the order of laminated layers in a laminate configuration. Also, the terms "upper side" and "lower side" apply not only to cases in which two constituent elements are arranged with a gap therebetween and a constituent element exists between the two constituent elements but also to cases in which two constituent elements are arranged to adhere to each other and contact each other.

Also, herein, the "plan view" refers to a view in a direction orthogonal to a major surface of a semiconductor substrate.

First Embodiment

[1. Circuit Configuration]

FIG. 1 is a diagram showing an exemplary circuit configuration of an imaging device 100 according to a first embodiment. As illustrated in FIG. 1, the imaging device 100 includes a plurality of pixels 10 and peripheral circuitry. The pixels 10 are, for example, two-dimensionally arrayed to form a pixel region RA. For simplicity, in FIG. 1, four pixels 10 of the plurality of pixels 10 are illustrated, and the other pixels 10 are not illustrated.

For example, when the imaging device 100 complies with a video graphics array (VGA) standard, the imaging device 100 includes about three-hundred thousand pixels 10 arrayed in a matrix. Also, when the imaging device 100 complies with an 8K standard, the imaging device 100 includes about 36 million pixels 10 arrayed in a matrix. The above-described peripheral circuitry is arranged in a peripheral region outside the pixel region RA.

Needless to say, the number of pixels 10 and the arrangement thereof are not limited to this example. The array of the pixels 10 may be one-dimensional. In this case, the imaging device 100 can be used as a line sensor.

The pixels 10 are connected to power-supply wires 22. During operation of the imaging device 100, a predetermined power-supply voltage ANDD is applied to the pixels 10 through the power-supply wires 22. Accumulation control lines 17 are connected to the pixels 10. As will be described later in detail, each of the pixels 10 includes a photoelectric converter that photoelectrically converts incident light and a signal detection circuit that detects a signal generated by the photoelectric converter. In a typical embodiment, the accumulation control lines 17 apply a predetermined voltage to all the photoelectric converters in the pixels 10.

In the configuration illustrated in FIG. 1, the peripheral circuitry of the imaging device 100 includes a vertical scanning circuit 16, a plurality of load circuits 19, a plurality of column signal processing circuits 20, a plurality of inverting amplifiers 24, and a horizontal signal readout circuit 21. The load circuit 19, the column signal processing circuit 20, and the inverting amplifier 24 are arranged for each column of the pixels 10 that are arrayed two-dimensionally. The vertical scanning circuit is also called a row scanning circuit. The column signal processing circuits are also called row signal accumulation circuits. The horizontal signal readout circuit is also called a column scanning circuit.

Address signal lines 30 and reset signal lines 26 are connected to the vertical scanning circuit 16. The vertical scanning circuit 16 applies a predetermined voltage to the address signal lines 30 to thereby select, for each row, the pixels 10 arranged in the row, As a result of selecting the pixels 10 for each row, readout of signal voltages of the selected pixels 10 and reset of signal charge described below are executed.

In the illustrated example, feedback control lines 28 and sensitivity adjustment lines 32 are further connected to the vertical scanning circuit 16. The vertical scanning circuit 16 applies a predetermined voltage to the feedback control lines 28 to thereby form feedback loops for negatively feeding back outputs of the pixels 10. Also, the vertical scanning circuit 16 can supply a predetermined voltage to the pixels 10 via the sensitivity adjustment lines 32.

The imaging device 100 has vertical signal lines 18 provided for the respective columns of the pixels 10. The load circuits 19 are electrically connected to the vertical signal lines 18, respectively. The pixels 10 are electrically connected to the column signal processing circuits 20 through the corresponding vertical signal lines 18.

The column signal processing circuits 20 perform noise suppression signal processing typified by correlated double sampling, analog-to-digital conversion, and so on. The horizontal signal readout circuit 21 is electrically connected to the column signal processing circuits 20 provided corresponding to the respective columns of the pixels 10. The horizontal signal readout circuit 21 sequentially reads out signals from the column signal processing circuits 20 to a horizontal common signal line 23.

As illustrated in FIG. 1, the power-supply wires 22, feedback lines 25, and the vertical signal lines 18 extend in upper and lower directions in FIG. 1, that is, in column directions of the pixels 10. Each of the feedback lines 25 and each of the vertical signal lines 18, the feedback lines 25 and the vertical signal lines 18 being provided for the corresponding columns of the pixels 10, have connections with corresponding two or more pixels 10 that are arranged along the column directions. Meanwhile, the accumulation control lines 17, the reset signal lines 26, the feedback control lines 28, the address signal lines 30, and the sensitivity adjustment lines 32 extend, for example, in row directions of the pixels 10. These signal lines are connected to each of the pixels 10 arranged in the row directions, The accumulation control lines 17 and the sensitivity adjustment lines 32 may extend in the column directions of the pixels 10. The accumulation control lines 17 and the sensitivity adjustment lines 32 may be connected to the pixels 10 arranged in the column directions.

In the configuration illustrated in FIG. 1, the inverting amplifiers 24 are provided corresponding to the respective columns of the pixels 10. A negative-side input terminal of each inverting amplifier 24 is connected to the corresponding vertical signal line 18, and a predetermined voltage Vref is supplied to a positive-side input terminal of each inverting amplifier 24. The voltage Vref is, for example, a positive voltage of 1 V or around 1 V. An output terminal of each inverting amplifier 24 is connected to the pixels 10 having connections with the negative-side input terminal of the inverting amplifier 24 through one of the feedback lines 25 provided corresponding to the columns of the pixels 10. Each inverting amplifier 24 constitutes a part of the feedback circuit for negatively feeding back outputs from the pixels 10. The inverting amplifiers 24 may be called feedback amplifiers.

Figure 2:
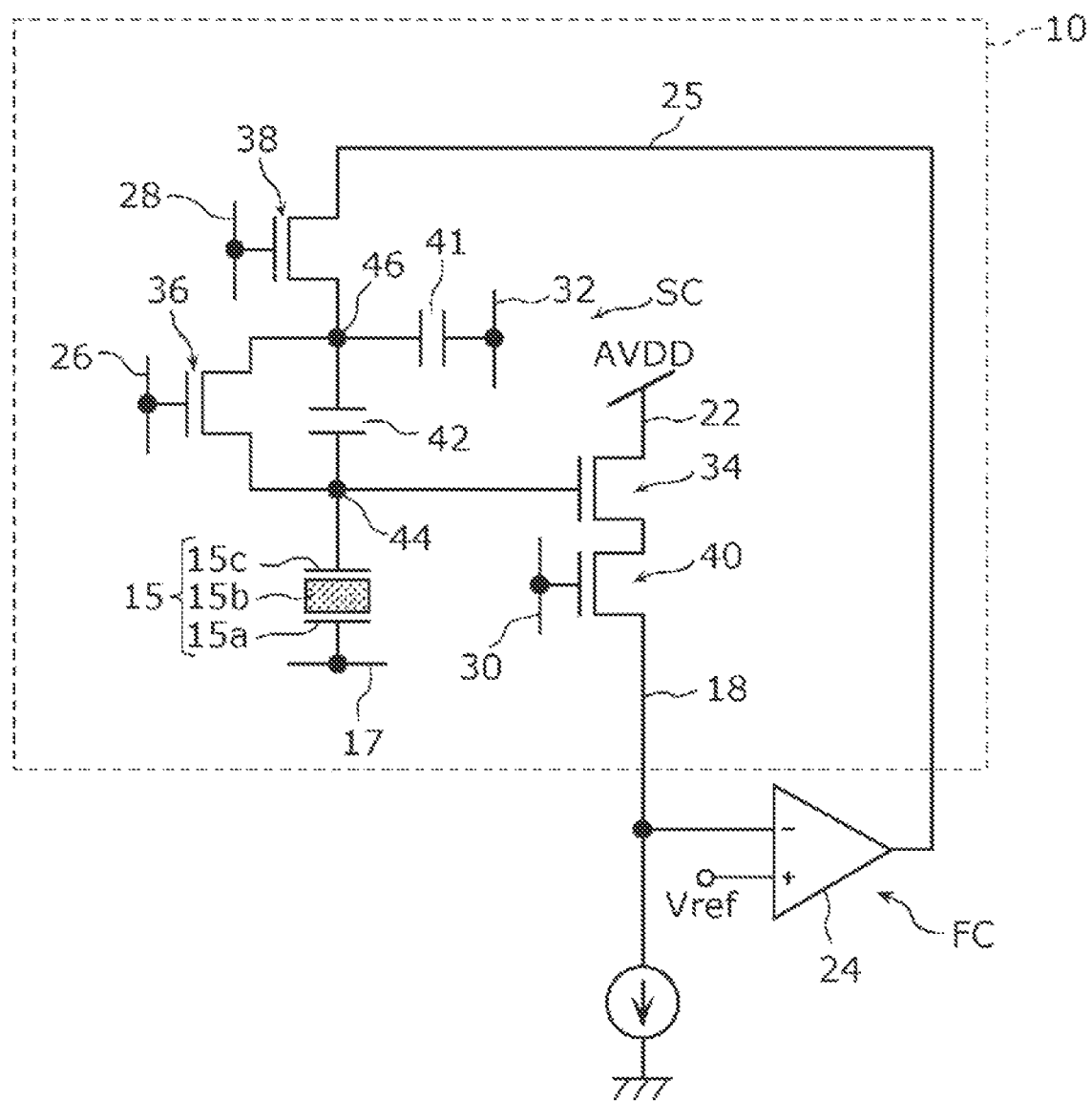
FIG. 2 is a diagram showing one example of a circuit configuration of each pixel included in the imaging device according to the first embodiment.

FIG. 2 is a diagram showing one example of the circuit configuration of each of the pixels 10 included in the imaging device 100 according to the present embodiment. In the present embodiment, the pixels 10 included in the imaging device 100 have substantially the same configuration.

As illustrated in FIG. 2, each pixel 10 includes a photoelectric converter 15 and a signal detection circuit SC. In the configuration illustrated in FIG. 2, the imaging device 100 includes a feedback circuit FC for negatively feeding back outputs of the signal detection circuit SC.

The photoelectric converter 15 has a first electrode 15a, a photoelectric conversion layer 15b, and a second electrode 15c, which serves as a pixel electrode. The first electrode 15a of the photoelectric converter 15 is connected to the corresponding accumulation control line 17. The second electrode 15c of the photoelectric converter 15 is connected to a charge accumulation node 44. Controlling the potential of the first electrode 15a through the accumulation control line 17 allows the second electrode 15c to collect charge having one of the polarities of positive (specifically, holes) charge and negative charge (specifically, electrons) generated in the photoelectric conversion layer 15b by photoelectric conversion. For example, when holes are used as the signal charge, it is sufficient that the potential of the first electrode 15a be made higher than the potential of the second electrode 15c. A case in which holes are used as the signal charge will be described below by way of example. For example, a voltage of about 10 V is applied to the first electrode 15a through the accumulation control line 17. As a result, signal charge is accumulated at the charge accumulation node 44. Electrons may also be used as the signal charge.

The signal detection circuit SC includes a signal detection transistor 34 and a first capacitive element 41. The signal detection transistor 34 amplifies a signal generated by the photoelectric converter 15 and outputs the signal. In the illustrated example, the signal detection circuit SC further includes a reset transistor 36, a feedback transistor 38, a second capacitive element 42 having a capacitance value smaller than that of the first capacitive element 41, and an address transistor 40. As described above, in the present embodiment, each of the pixels 10 has one or more capacitive elements therein. Since the first capacitive element 41 has a relatively large capacitance value, for example, kTC noise can be effectively reduced, as will be described later in detail. An example in which N-channel metal-oxide-semiconductor field-effect transistors (MOSFETs) are used as transistors, such as the signal detection transistor 34, will be described below.

A gate of the signal detection transistor 34 is connected to the charge accumulation node 44. In other words, a gate of the signal detection transistor 34 is connected to the second electrode 15c. A drain of the signal detection transistor 34 is connected to the power-supply wire 22, which serves as a source-follower power supply, and a source of the signal detection transistor 34 is connected to the vertical signal line 18 via the address transistor 40. The signal detection transistor 34 and the load circuit 19 (see FIG. 1), which is not illustrated in FIG. 2, constitute a source follower circuit.

In the example illustrated in FIG. 2, the address transistor 40 is connected between the source of the signal detection transistor 34 and the vertical signal line 18. A gate of the address transistor 40 is connected to the address signal line 30. When signal charge is accumulated in the charge accumulation node 44, a voltage corresponding to the amount of the accumulated signal charge is applied to the gate of the signal detection transistor 34. The signal detection transistor 34 amplifies the voltage applied to the gate thereof. When the address transistor 40 is turned on, the voltage amplified by the signal detection transistor 34 is selectively read out as a signal voltage. The address transistor 40 may be connected between the drain of the signal detection transistor 34 and the power-supply wire 22. That is, the drain of the signal detection transistor 34 may be connected to the power-supply wire 22 via the address transistor 40, In the configuration illustrated in FIG. 2, one of a pair of electrodes of the first capacitive element 41 is connected to the sensitivity adjustment line 32. A pad is connected to the sensitivity adjustment line 32, and the potential of the sensitivity adjustment lines 32 is adjusted with a voltage applied to the pad. For example, during operation of the imaging device 100, the potential of the sensitivity adjustment line 32 is fixed to a certain potential, such as 0 V. The sensitivity adjustment line 32 can be used to control the potential of the charge accumulation node 44. The other of the pair of electrodes of the first capacitive element 41 is connected to one of a pair of electrodes of the second capacitive element 42. A node including a connection point of the first capacitive element 41 and the second capacitive element 42 may hereinafter be referred to as a "reset drain node 46".

The other of the pair of electrodes of the second capacitive element 42 is connected to the charge accumulation node 44. That is, of the pair of electrodes of the second capacitive element 42, the electrode that is not connected to the reset drain node 46 has electrical connection with the second electrode 15c of the photoelectric converter 15. In the example illustrated in FIG. 2, the reset transistor 36 is connected in parallel with the second capacitive element 42. A gate of the reset transistor 36 is connected to the reset signal line 26.

In the configuration illustrated in Fig, 2, the pixel 10 includes the feedback transistor 38. As illustrated in FIG. 2, one of a source and a drain of the feedback transistor 38 is connected to the reset drain node 46. The other of the source and the drain of the feedback transistor 38 is connected to the feedback line 25. A gate of the feedback transistor 38 is connected to the feedback control line 28.

[2. Device Structure of Pixels]

Next, one example of the device structure of each pixel 10 will be described with reference to FIGS. 3 to 5.

Figure 3:
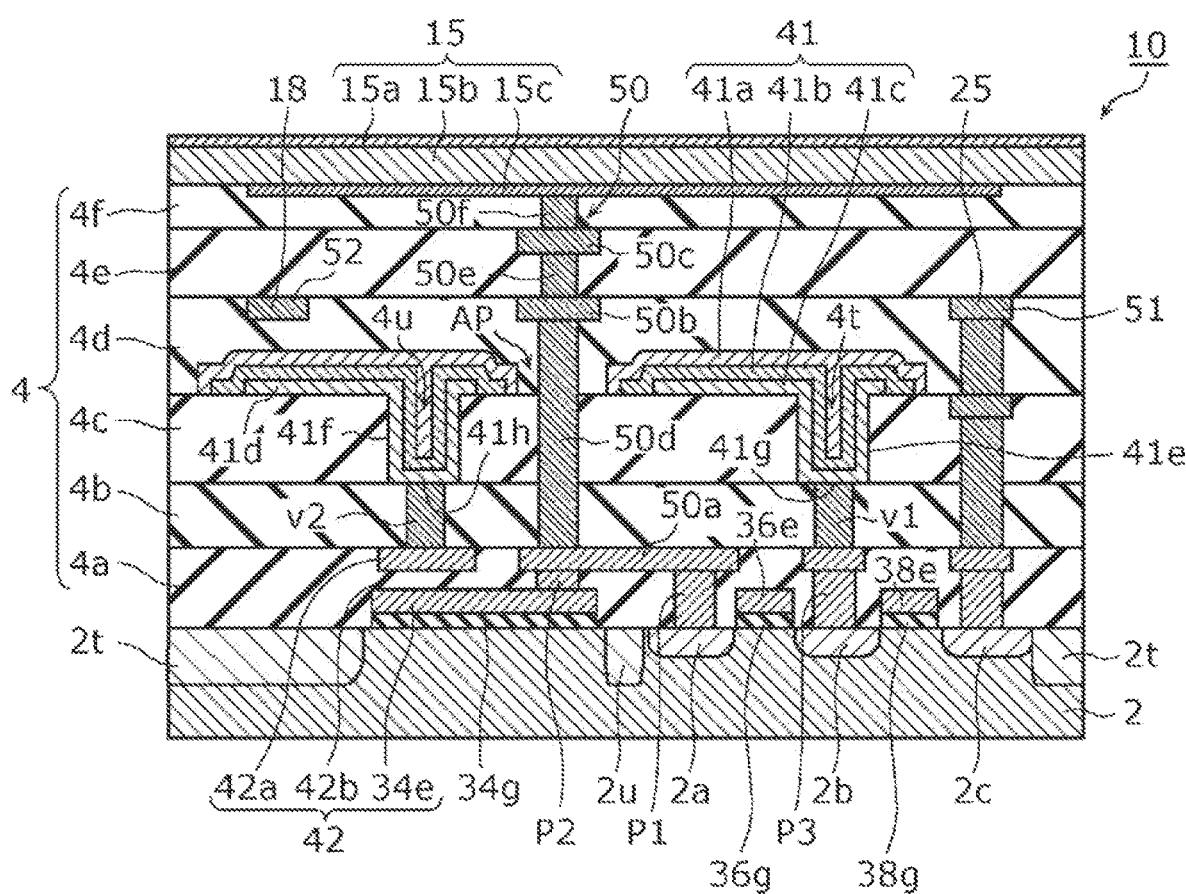
FIG. 3 is a schematic sectional view of each pixel included in the imaging device according to the first embodiment.

FIG. 3 is a schematic sectional view of each pixel 10 included in the imaging device 100 according to the present embodiment. FIG. 4 is a schematic plan view showing one example of a layout of elements included in each pixel 10 included in the imaging device 100 according to the present embodiment, FIG. 3 schematically illustrates a cross section along line 111-111 illustrated in FIG. 4.

In FIG. 3, hatching indicating a cross section is not applied to insulating layers 4a, 4b, 4c, 4d, 4e, and 4f included in an interlayer insulating layer 4. The same applies to FIGS. 6A to 6I, FIGS. 7 and 8, and FIGS. 12 to 15, which are described below.

Figure 4:
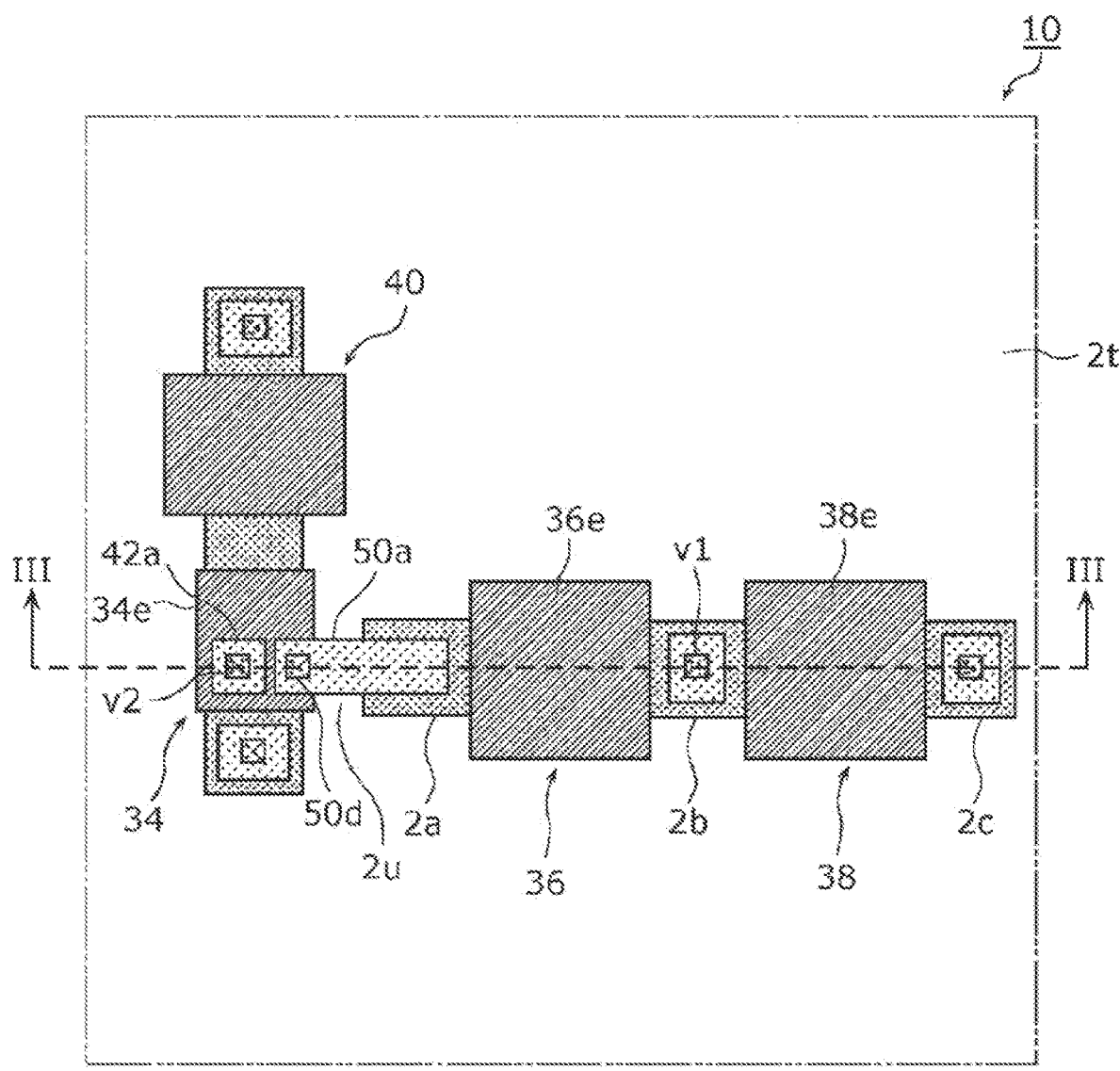
FIG. 4 is a schematic plan view showing one example of a layout of elements included in each pixel included in the imaging device according to the first embodiment.

As illustrated in FIG. 4, the imaging device 100 has a semiconductor substrate 2. For example, a silicon substrate can be used as the semiconductor substrate 2. The semiconductor substrate 2 is not limited to a substrate that is entirely made of semiconductor material. For example, the semiconductor substrate 2 may be an insulating substrate having a semiconductor layer on its surface. In this case, a p-type silicon substrate will be described as the semiconductor substrate 2 by way of example.

The pixels 10 are formed at the semiconductor substrate 2. An element isolation region 2t formed in the semiconductor substrate 2 electrically isolate each of the pixels 10 from the other pixels 10. The element isolation region 2t is formed, for example, by acceptor ion-implantation under a predetermined implantation condition.

In the example illustrated in FIG. 3, the interlayer insulating layer 4 that covers the semiconductor substrate 2 is arranged between the semiconductor substrate 2 and the photoelectric converter 15. The interlayer insulating layer 4 has a laminated structure of the insulating layers 4a, 4b, 4c, 4d, 4e, and 4f. Each of the insulating layers 4a, 4b, 4c, 4d, 4e, and 4f is formed of, for example, silicon dioxide, In this example, the photoelectric converter 15 is located on the insulating layer 4f that is located farthest from the semiconductor substrate 2.

Impurity regions 2a, 2b, and 2c are formed in the semiconductor substrate 2. All the impurity regions 2a, 2b, and 2c are, for example, regions where N-type dopants are diffused. A gate insulating layer 36g and a gate electrode 36e of the reset transistor 36 are provided in that order in a region located on a major surface of the semiconductor substrate 2 and between the impurity regions 2a and 2b. Also, a gate insulating layer 38g and a gate electrode 38e of the feedback transistor 38 are provided in that order in a region located on the major surface of the semiconductor substrate 2 and between the impurity regions 2b and 2c. The major surface of the semiconductor substrate 2 is a surface that is included in a plurality of surfaces of the semiconductor substrate 2 and at which the interlayer insulating layer 4 and the photoelectric converter 15 are provided. The major surface of the semiconductor substrate 2 is covered by the insulating layer 4a in the interlayer insulating layer 4.

The impurity region 2a functions as one of a drain region and a source region of the reset transistor 36. The impurity region 2b functions as the other of the drain region and the source region of the reset transistor 36. In the example illustrated in FIG. 3, the reset transistor 36 and the feedback transistor 38 share the impurity region 2b and are thereby electrically connected to each other. That is, the impurity region 2b also functions as one of a drain region and a source region of the feedback transistor 38.

The impurity region 2c functions as the other of the drain region and the source region of the feedback transistor 38. The impurity region 2c is connected to the feedback line 25, which extends across two or more of the pixels 10, through a plug, a via, and a wiring layer arranged in the interlayer insulating layer 4. As illustrated in FIG. 1, the feedback line 25 is a signal line that extends to outside of the pixel region RA.

In the configuration illustrated in FIG. 3, a portion included in the feedback line 25 and located in one pixel 10 of interest is included in a wiring layer 51 located between the second electrode 15c of the photoelectric converter 15 and the semiconductor substrate 2. Also, a wiring layer 52 located in the same layer as the wiring layer 51 also includes a portion included in the vertical signal line 18 and located in the pixel 10 of interest. That is, in this example, in the pixel 10, the vertical signal line 18 and the feedback line 25 are located in the same layer, Similarly to the feedback line 25, the vertical signal line 18 is also a signal line that extends to outside of the pixel region RA.

The "same layer" means being located in a common insulating layer. In this case, when the common insulating layer is a planarization film, heights from the major surface of the semiconductor substrate 2 become substantially equal to each other.

Also, the signal lines that extend to outside of the pixel region RA include not only the vertical signal line 18 and the feedback line 25 but also the reset signal line 26, the feedback control line 28, the address signal line 30, and the sensitivity adjustment line 32. At least one of the wiring layer 51 or the wiring layer 52 may include parts of the reset signal line 26, the feedback control line 28, the address signal line 30, or the sensitivity adjustment line 32, each of which being a control line for driving two or more pixels.

A gate insulating layer 34g and a gate electrode 34e of the signal detection transistor 34 are further provided on the major surface of the semiconductor substrate 2 in that order. As can be understood with reference to FIG. 4, a drain region and a source region of the signal detection transistor 34 are located at the front side and the back side, respectively, of the plane of FIG. 3. In the example illustrated in FIG. 3, a pair of the reset transistor 36 and the feedback transistor 38 and a pair of the signal detection transistor 34 and the address transistor 40 (not illustrated in FIG. 3) are isolated by an element isolation region 2u. Similarly to the element isolation region 2t, the element isolation region 2u can be formed, for example, by acceptor ion-implantation under a predetermined implantation condition. Each of the element isolation regions 2t and 2u may be an insulation region formed by a shallow trench isolation (STI) process. The element isolation regions 2t and 2u are integrally formed in the pixel region RA.

As illustrated in FIG. 3, each pixel 10 has, in the interlayer insulating layer 4, a connection portion 50 that electrically connects the impurity region 2a in the semiconductor substrate 2 to the second electrode 15c of the photoelectric converter 15. The impurity region 2a is one example of an impurity region electrically connected to the photoelectric converter 15. The impurity region 2a functions as at least one part of a charge accumulation region in which signal charge generated by the photoelectric converter 15 is accumulated.

The connection portion 50 includes plugs P1 and P2 and a wiring portion 50a. A lower end of the plug P1 is connected to the impurity region 2a in the semiconductor substrate 2, and an upper end of the plug P1 is connection to the wiring portion 50a. A lower end of the plug P2 is connected to the gate electrode 34e of the signal detection transistor 34, and an upper end of the plug P2 is connected to the wiring portion 50a. The wiring portion 50a provides mutual connection between the plug P1 and the plug P2. The plugs P1 and P2 and the wiring portion 50a provide electrical interconnection between the impurity region 2a and the gate electrode 34e. That is, the impurity region 2a, which functions as the drain region or the source region of the reset transistor 36, and the gate electrode 34e of the signal detection transistor 34 are electrically connected to the second electrode 15c of the photoelectric converter 15 via the connection portion 50.

The plugs P1 and P2 and the wiring portion 50a are formed using electrically conductive material. For example, the plugs P1 and P2 and the wiring portion 50a are formed using polysilicon given electrical conductivity by impurity doping. At least one of the plug P1, the plug P2, or the wiring portion 50a may be formed using metal material, such as copper.

The connection portion 50 further includes wiring layers 50b and 50c and vias 50d, 50e, and 50f. The via 50d, the wiring layer 50b, the via 50e, the wiring layer 50c, and the via 50f are provided between the wiring portion 50a and the second electrode 15c in that order from the semiconductor substrate 2. The wiring layers 50b and 50c and the vias 50d,

50e, and 50f are formed, for example, using metal material, such as copper. Alternatively, the wiring layers 50b and 50c and the vias 50d, 50e, and 50f may be formed using electrically conductive material, such as polysilicon given electrical conductivity, other than metal material.

As illustrated in FIG. 3, the wiring layer 50b is located in the same layer as the wiring layers 51 and 52. For example, the wiring layer 50b, the wiring layer 51, and the wiring layer 52 can be formed at the same time. In this case, the wiring layer 50b, the wiring layer 51, and the wiring layer 52 are the same in thickness and material. Accordingly, the wiring layers 51 and 52 may also be formed of metal, such as copper.

The number of wiring layers arranged in the interlayer insulating layer 4 and the number of insulating layers in the interlayer insulating layer 4 are not limited to the example illustrated in FIG. 3 and ca be set arbitrarily.

The photoelectric converter 15 supported by the semiconductor substrate 2 includes the first electrode 15a, the photoelectric conversion layer 15b, and the second electrode 15c. The photoelectric converter 15 has a structure in which the photoelectric conversion layer 15b is sandwiched between the first electrode 15a and the second electrode 15c.

The first electrode 15a of the photoelectric converter 15 is provided at a side on which light from a subject is incident. The first electrode 15a is formed of transparent electrically conductive material, such as indium tin oxide (ITO). The first electrode 15a may be formed directly on the photoelectric conversion layer 15b or another layer may be arranged between the first electrode 15a and the photoelectric conversion layer 15b.

In response to incidence of light, the photoelectric conversion layer 15b causes positive and negative charge, specifically, hole-electron pairs, to be generated. The photoelectric conversion layer 15b is formed of organic material or inorganic material, such as amorphous silicon. The photoelectric conversion layer 15b may include a layer composed of organic material and a layer composed of inorganic material.

The second electrode 15c is located closer to the semiconductor substrate 2 than the first electrode 15a and the photoelectric conversion layer 15b. The second electrodes 15c are provided separately for the respective pixels 10. Specifically, each second electrode 15c is spatially isolated from the second electrodes 15c in other adjacent pixels 10, so that the second electrode 15c is electrically isolated therefrom. The second electrode 15c collects charge generated by photoelectric conversion in the photoelectric conversion layer 15b. The second electrode 15c is formed of, for example, metal such as aluminum or copper, metal nitride, polysilicon, or the like given electrical conductivity by impurity doping.

The first electrode 15a and the photoelectric conversion layer 15b are formed, for example, through two or more pixels 10. Alternatively, similarly to the second electrode 15c, at least one of the first electrode 15a or the photoelectric conversion layer 15b in one pixel 10 may be spatially isolated from the at least one electrode in another pixel 10.

In the present embodiment, the first capacitive element 41 is provided in the interlayer insulating layer 4 between the photoelectric converter 15 and the semiconductor substrate 2. Specifically, the first capacitive element 41 is located between the wiring layers 51 and 52, which include at least parts of signal lines connected to two or more pixels 10, and the semiconductor substrate 2. In the configuration illustrated in FIG. 3, the first capacitive element 41 is located between the wiring layers 52 and 51, which respectively include a part of the vertical signal line 18 and a part of the feedback line 25, and the semiconductor substrate 2. In other words, in the present embodiment, the first capacitive element 41 has an arrangement such that it is located closer to the semiconductor substrate 2 than the wiring layers including parts of the signal lines connected to two or more pixels 10. That is, in the present embodiment, of the wiring layers included in the imaging device 100, the number of wiring layers located at an upper side of the first capacitive elements 41 is larger than the number of wiring layers located at a lower side of the first capacitive elements 41. A wiring layer does not necessarily have to be provided at the lower side of the first capacitive elements 41.

Each first capacitive element 41 has a top electrode 41a, a bottom electrode 41c, and a dielectric layer 41b arranged between the top electrode 41a and the bottom electrode 41c. The top electrode 41a is one example of a second electrode and is located between the wiring layer 52 and the semiconductor substrate 2 in the sectional view in FIG. 3. The bottom electrode 41c is one example of a first electrode and is located between the top electrode 41a and the semiconductor substrate 2.

The bottom electrode 41c, the dielectric layer 41b, and the top electrode 41a are laminated in that order from the semiconductor substrate 2. The dielectric layer 41b is in contact with the bottom electrode 41c to cover the entire bottom electrode 41c. The bottom electrode 41c is covered by the dielectric layer 41b and is thus not exposed to outside. The top electrode 41a is in contact with the dielectric layer 41b to cover the dielectric layer 41b. The top electrode 41a and the bottom electrode 41c are not in contact with each other, since the dielectric layer 41b is arranged therebetween.

The first capacitive element 41 is a trench capacitor. Specifically, the first capacitive element 41 includes at least one trench portion. In the example illustrated in FIG. 3, the first capacitive element 41 includes a planar portion 41d and two trench portions 41e and 41f. The two trench portions 41e and 41f are provided so as to sandwich the connection portion 50 therebetween in sectional view.

The planar portion 41d is a portion that is included in the first capacitive element 41 and that is located on an upper surface of the insulating layer 4c. The trench portion 41e is a portion that is included in the first capacitive element 41 and that is located in a trench 4t provided in the insulating layer 4c. The trench portion 41f is a portion that is included in the first capacitive element 41 and that is located in a trench 4u provided in the insulating layer 4c. In each of the planar portion 41d and the trench portions 41e and 41f, the bottom electrode 41c and the dielectric layer 41b are formed with a generally uniform film thickness. The top electrode 41a is provided so as to fill insides of the trenches 4t and 4u. Alternatively, the top electrode 41a may also be formed with a generally uniform film thickness.

With this configuration, not only the planar portion 41d but also the trench portions 41e and 41f contribute to a capacitance value of the first capacitive element 41. Compared with a parallel flat plate capacitor that does not have the trench portions 41e and 41f, the first capacitive element 41 has a capacitance value increased by an amount corresponding to the surface areas of wall surfaces of the trenches 4t and 4u. Thus, since the first capacitive element 41 includes the trench portions 41e and 41f, it is possible to increase the capacitance value, while suppressing an increase in the area occupied in plan view. The first capacitive element 41 may have only one of the trench portions 41e and 41f.

In the present embodiment, at least one of the bottom electrode 41c or the top electrode 41a has two or more electrical contact points. The two or more electrical contact points are electrically connected to different electrical elements, respectively. In the example illustrated in FIG. 3, the bottom electrode 41c has two contact points 41g and 41h. The two contact points 41g and 41h are provided at the trench portions 41e and 41f, respectively.

Specifically, the contact point 41g is provided at a bottom surface of the trench portion 41e. The bottom surface refers to a surface (specifically, a lower surface) of the trench portion 41e, the surface being adjacent to the semiconductor substrate 2. The contact point 41g is a point of contact with a via v1 at the bottom surface of the trench portion 41e. The via v1 is coupled to the impurity region 2b via a plug P3. That is, the contact point 41g is electrically connected to the reset transistor 36 and the feedback transistor 38. Each of the reset transistor 36 and the feedback transistor 38 is one example of an electrical element to which the contact point 41g is electrically connected. As described above, one contact point included in the first capacitive element may be connected to a plurality of electrical elements.

The contact point 41h is provided at a bottom surface of the trench portion 41f. The contact point 41h is a point of contact with a via v2 at the bottom surface of the trench portion 41f. The via v2 is coupled to an electrode 42a. The electrode 42a overlaps the gate electrode 34e with an insulating film 42b being interposed therebetween. That is, the electrode 42a and the gate electrode 34e are included in the second capacitive element 42. The second capacitive element 42 is one example of an electrical element to which the contact point 41h is electrically connected. As described above, the contact point 41g and the contact point 41h are respectively connected to the electrical elements that are different from each other.

A desired capacitance value can be realized for a capacitance value of the second capacitive element 42 by adjusting the material or the thickness of the insulating film 42b or the area where the electrode 42a and the gate electrode 34e overlap each other.

Although a method for forming the first capacitive element 41 is described later, providing the contact points 41g and 41h of the bottom electrode 41c at the bottom surfaces of the trench portions 41e and 41f makes it possible to reduce the value of contact resistance between the bottom electrode 41c and the vias v1 and v2. This makes it possible to suppress variations in the value of the contact resistance in each pixel 10.

The bottom electrode 41c of the first capacitive element 41, the via v1, the plug P3, the via v2, and the electrode 42a constitute parts of the reset drain node 46. As illustrated in FIG. 2, the charge accumulation node 44 is electrically coupled with the reset drain node 46 via the second capacitive element 42. Thus, the potential of the charge accumulation node 44 can vary upon a potential variation in the reset drain node 46.

That is, even when the contact resistance between the bottom electrode 41c and the vias v1 and v2 vary among the pixels 10, this variation leads to a fluctuation of the potential of the reset drain node 46. For example, even when light with the same amount of light is incident on the individual pixels 10, and the same amounts of charge are generated by the photoelectric converters 15, the potentials of the charge accumulation nodes 44 do not become the same among the pixels 10 when the potentials of the reset drain nodes 46 vary. Thus, an image that is acquired looks like noise (also called roughness) is occurring.

In the present embodiment, reducing the resistance values of the reset drain nodes 46 makes it possible to bring the potentials of the reset drain nodes 46 in all the pixels 10 close to a constant potential.

The top electrode 41a of the first capacitive element 41 can be a part of the wiring layers located between the second electrode 15c of the photoelectric converter 15 and the gate electrode 34e of the signal detection transistor 34. The top electrode 41a is electrically connected to a pad not illustrated in FIG. 3. The pad is, for example, a portion to which a predetermined voltage is applied. For example, the pad is connected to the top electrode 41a through the sensitivity adjustment line 32. As illustrated in FIG. 5, the top electrode 41a extends in a plane that is parallel to the major surface of the semiconductor substrate 2. The same applies to the bottom electrode 41c and the dielectric layer 41b.

Each of the top electrode 41a and the bottom electrode 41c is formed using electrically conductive material, such as metal or a metal compound. A metal simple substance, such as titanium (Ti), aluminum (Al), gold (Au), or platinum (Pt), or a metal alloy of two or more types thereof is used as the electrically conductive material, Alternatively, electrically conductive metal nitride, such as titanium nitride (TiN), tantalum nitride (TaN), or hafnium nitride (HfN), may be used as the electrically conductive material. The top electrode 41a and the bottom electrode 41c may be formed using the same type of material or may be formed using types of material that are different from each other.

The dielectric layer 41b is formed using a so-called high-k material having a higher dielectric constant than silicon oxide. Specifically, the dielectric layer 41b contains hafnium (Hf) or zirconium (Zr) oxide of as a main component.

As described above, the first capacitive element 41 has a metal-insulator-metal (UM) structure in which a dielectric body is sandwiched between two electrodes formed of metal or a metal compound. In this case, in order to equalize the potentials of the reset drain nodes 46 in the pixels 10, it is desirable that leakage current that flows between the top electrode 41a and the bottom electrode 41c be reduced as much as possible. This is because, when leakage current is large, the charge of the reset drain node 46 flows through the sensitivity adjustment line 32 connected to the top electrode 41a.

In theory, there should be no leakage current that flows via the dielectric layer 41b located between the top electrode 41a and the bottom electrode 41c. However, in the present embodiment, a high-k material having a high refractive index is used for the dielectric layer 41b in order to increase the capacitance value of the first capacitive element 41. Thus, the bandgap of the dielectric layer 41b is reduced. Also, for the same purpose, the film thickness of the dielectric layer 41b is reduced in a range of about 5 nm or more and about 40 nm or less. For these reasons, in practice, the leakage current tends to increase.

In order to suppress the leakage current, surface roughness of the top electrode 41a and the bottom electrode 41c may be reduced. The leakage current and the surface roughness of each electrode have a relationship in which the leakage current increases as the surface roughness increases. For example, when the surface roughness of the top electrode 41a and the bottom electrode 41c is high, the thickness of the dielectric layer 41b becomes uneven. Since an electric field tends to be concentrated at a portion where the dielectric layer 41b is thin, the leakage current is likely to increase.

In contrast, in the present embodiment, for example, TiN or TaN is used as the electrically conductive material of which the top electrode 41a and the bottom electrode 41c are formed. Thus, since TiN or TaN allows the surface roughness to be reduced when it is deposited, the leakage current of the first capacitive element 41 can be suppressed. Also, making the surface roughness of the bottom electrode 41c of the top electrode 41a uniform can also contribute to suppressing variations in the capacitance value of the first capacitive element 41 in each pixel 10. Also, since TiN or TaN has a low sheet resistance, it is possible to reduce resistance components that occur at the reset drain node 46.

Figure 5:
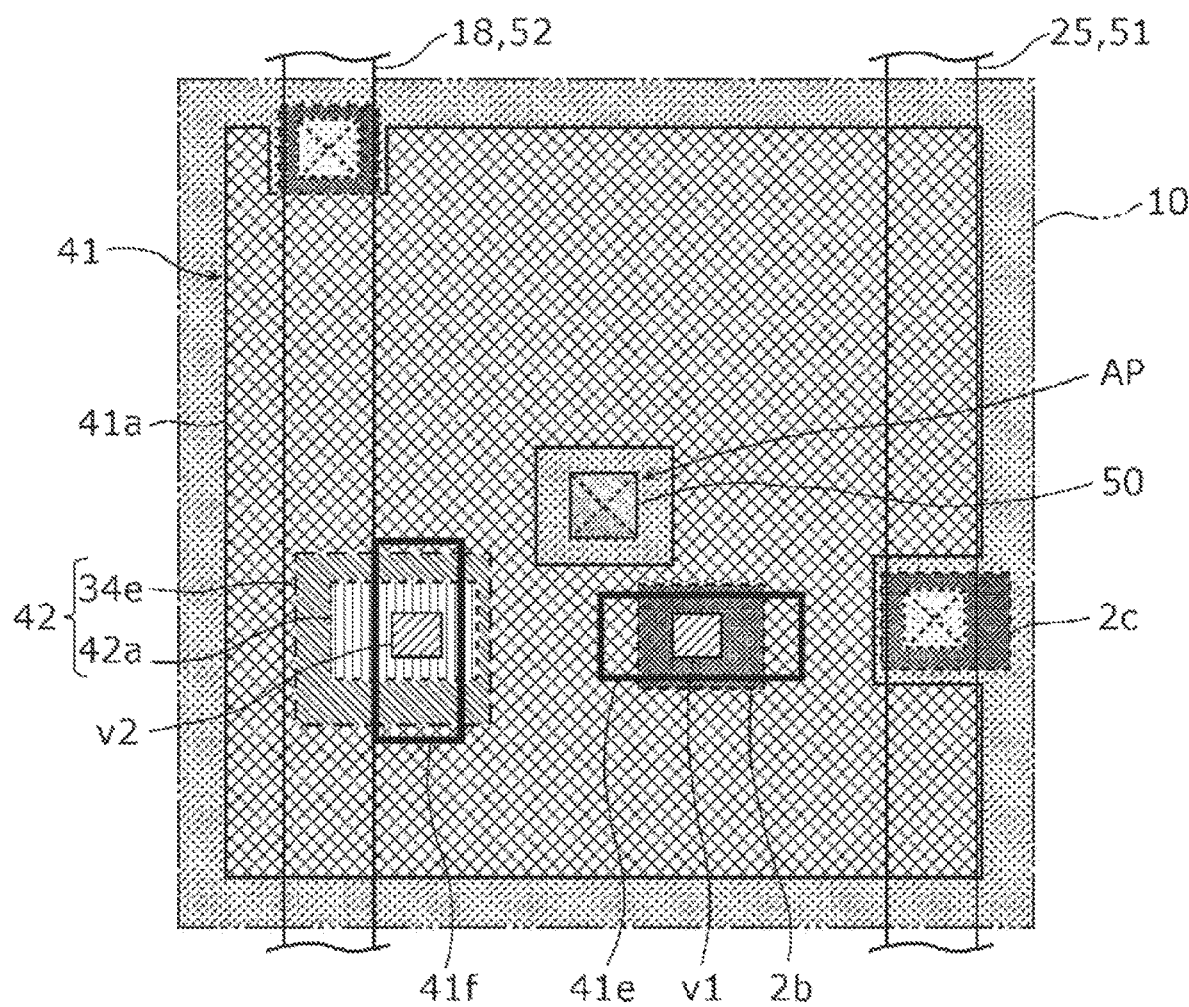
FIG. 5 is a schematic plan view showing one example of the shapes and the arrangements of a first capacitive element and trench portions included in each pixel included in the imaging device according to the first embodiment.

FIG. 5 is a schematic plan view showing one example of the shapes and the arrangements of the first capacitive element 41 and the trench portions 41e and 41f included in each pixel 10 included in the imaging device 100 according to the present embodiment. Specifically, FIG. 5 illustrates one example of positional relationships of the top electrode 41a, the trench portions 41e and 41f, the vias v1 and v2, the impurity regions 2b and 2c, and the second capacitive element 42, excluding the photoelectric converter 15 from the pixel 10, when viewed in a normal direction of the major surface of the semiconductor substrate 2.

In the example illustrated in FIG. 5, the vias v1 and v2 are formed at approximately centers of the respective trench portions 41e and 41f. The outer shapes of the trench portions 41e and 41f are denoted by thick solid lines. The via v1 is located immediately above the impurity region 2b to which it is connected. The via v2 is located immediately above the electrode 42a. The arrangements and the shapes of the trench portions 41e and 41f are not particularly limited.

As illustrated in FIG. 5, according to the present embodiment, the first capacitive element 41 in one pixel 10 has two or more trench portions 41e and 41f. As illustrated in FIG. 3, the contact points 41g and 41h are provided at respective bottom surfaces of the trench portions 41e and 41f. Since the contact points 41g and 41h obtain electrical connections with the respective different electrical elements, the reset drain node 46 can be designed with a shortest path and in accordance with a circuit diagram. Also, the reset drain node 46 is formed in a layer at a lower side of the wiring layer 51 including the feedback line 25 provided through two or more pixels 10 and the wiring layer 52 including the vertical signal line 18. Thus, the reset drain node 46 has a structure that is less vulnerable to influences of noise, thus making it possible to reduce influences of parasitic capacitance.

As illustrated in FIG. 5, the first capacitive element 41 is provided so as to occupy a majority portion of the pixels 10 in plan view. The plan-view shape of the first capacitive element 41 is generally rectangle, and an opening AP is provided at a center thereof. The plan-view shape of the first capacitive element 41 is substantially the same as the plan-view shape of the top electrode 41a. The opening AP is a through-hole for passage of the connection portion 50. The position where the opening AP is provided is not particularly limited.

Also, in the present embodiment, as can be understood with reference to FIG. 3, the first capacitive element 41 overlaps at least a part of the impurity region 2a in plan view. Specifically, at least one of the top electrode 41a or the bottom electrode 41c overlaps the impurity region 2a, For example, both the top electrode 41a and the bottom electrode 41c cover the entire impurity region 2a. That is, in plan view, the entire impurity region 2a is located inside the top electrode 41a and the bottom electrode 41a.

Each of the top electrode 41a and the bottom electrode 41c has a light-shielding property. Thus, light that is incident on the imaging device 100 and that travels in the interlayer insulating layer 4 without being photoelectrically converted by the photoelectric converter 15 is shielded by the top electrode 41a or the bottom electrode 41c. This makes it possible to suppress light that reaches the impurity region 2a. When light is incident on the impurity region 2a, charge is generated, which can cause noise. Suppression of light that reaches the impurity region 2a makes it possible to reduce noise.

[3. Manufacturing Method]

Subsequently, a manufacturing method for the imaging device 100 according to the present embodiment, particularly, a process for manufacturing the first capacitive element 41, will be described with reference to FIGS. 6A to 6I. FIGS. 6A to 6I are sectional views for describing a plurality of processes included in a process for manufacturing the first capacitive element 41. Although a description will be given below while paying attention to one trench portion 41e, the same description also applies to the trench portion 41f.

Figure 6A:
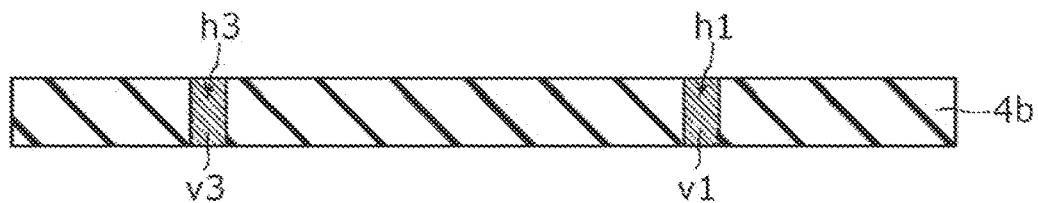
FIG. 6A is a schematic sectional view for describing a formation process for vias, the formation processing being included in a manufacturing method for the imaging device according to the first embodiment.

First, as illustrated in FIG. 6A, the vias v1 and v3 are formed in the insulating layer 4b deposited at an upper side of the semiconductor substrate 2 (not illustrated). In this case, although not illustrated in FIG. 6A, the via v2 is formed at the same time. Specifically, first, a plasma chemical vapor deposition (CVD) method or the Ike is used to form a silicon oxide film as the insulating layer 4b. Thereafter, the deposited insulating layer 4b is patterned by photolithography and etching to thereby form contact holes h1 and h3. Next, a vapor deposition method, a sputtering method, a CVD method, plating, or the Ike is used to fill the contact holes h1 and h3 with metal material, such as tungsten (W) or copper (Cu), to thereby form the vias v1 and v3.

The via vi is, for example, an electrically conductive via connected to the bottom electrode 41c of the first capacitive element 41. In the example illustrated in FIG. 6A, the via v3, in addition to the via v1, is formed at the same time. The via v3 is a part of the via 50d included in the connection portion 50 connected to the second electrode 15c of the photoelectric converter 15.

Figure 6B:
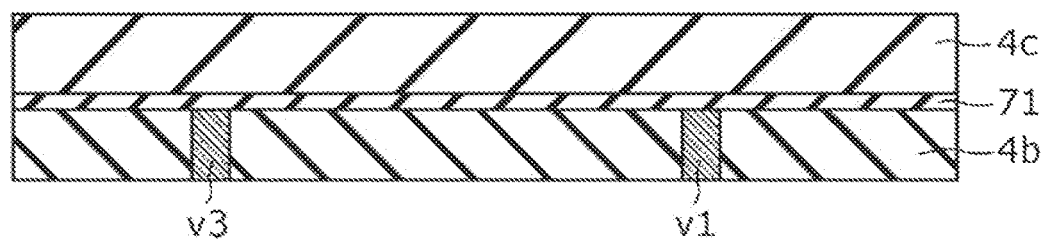
FIG. 6B is a schematic sectional view for describing a formation process for an insulating layer, the formation process being included in the manufacturing method for the imaging device according to the first embodiment.

Next, as illustrated in FIG. 6B, an insulating layer 71 and the insulating layer 4c are sequentially formed on an entire surface of the insulating layer 4b by a plasma CVD method. The insulating layer 71 is, for example, a silicon carbon nitride film (SiCN film). The insulating layer 4c is, for example, a silicon oxide film. The silicon carbon nitride film makes it possible to suppress diffusion of metal included in the vias v1 and v3. In FIG. 3, the insulating layer 71 is not illustrated. Also, the formation of the insulating layer 71 is not essential and may be omitted.

Figure 6C:
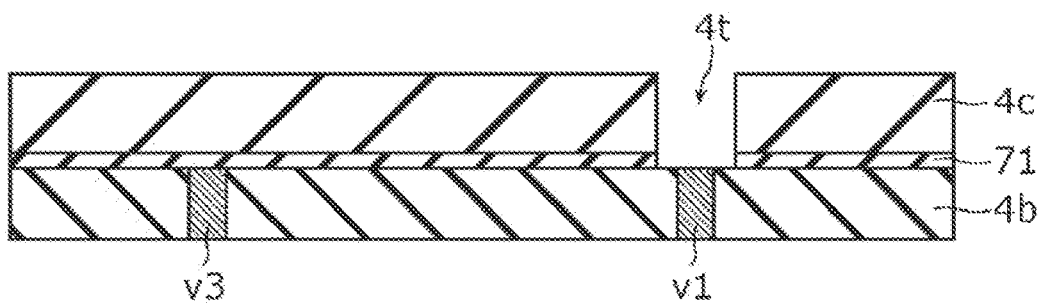
FIG. 6C is a schematic sectional view for describing a formation process for a trench, the formation process being included in the manufacturing method for the imaging device according to the first embodiment.

Next, as illustrated in FIG. 6C, the trench 4t that penetrates the insulating layer 71 and the insulating layer 4c is formed by dry etching. The trench 4t is a through-hole for exposing the via v1. When the first capacitive element 41 includes two or more trench portions, the trenches are formed at the same time. For example, the trenches 4t and 4u are formed at the same time.

Figure 6D:
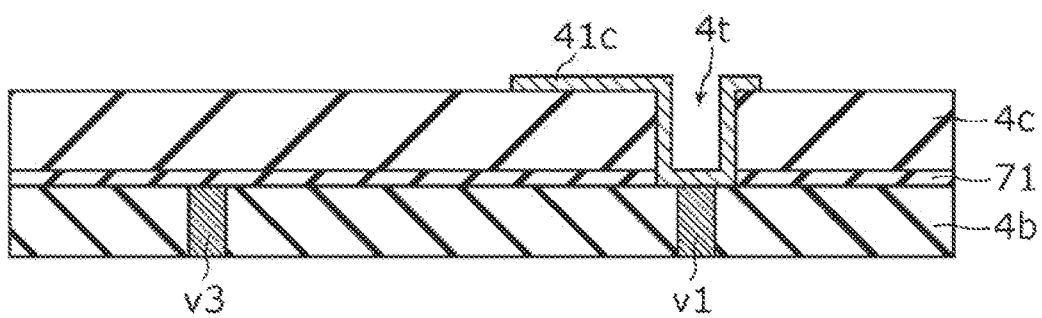
FIG. 6D is a schematic sectional view for describing a formation process for a bottom electrode, the formation processing being included in the manufacturing method for the imaging device according to the first embodiment.

Next, as illustrated in FIG. 6D, the bottom electrode 41c is formed. Specifically, first, an electrically conductive thin film, such as a titanium nitride film, is deposited. The titanium nitride film is formed, for example, by an atomic layer deposition (ALD) method or a plasma CVD method. Next, after a resist mask is formed on the deposited electrically conductive thin film, for example, a part of the electrically conductive thin film is removed by dry etching using chlorine ($Cl_2$) gas, and the resist mask is removed by oxygen ashing processing. As a result, the bottom electrode 41c patterned to have a predetermined shape is formed, as illustrated in FIG. 6D.

Continuously performing the formation process of the trench 4t and the deposition process of the electrically conductive thin film that constitutes the bottom electrode 41O makes it possible to reduce a contact resistance between the bottom electrode 41c and the via v1. In the process of forming the trench 4t, since a surface of the via v1 needs to be exposed to plasma, the state of the surface at which the via v1 is exposed is activated. In addition, forming the electrically conductive thin film facilitates that metal coupling is formed between the electrically conductive thin film and the via v1, thus making it possible to suppress the contact resistance.

Figure 6E:
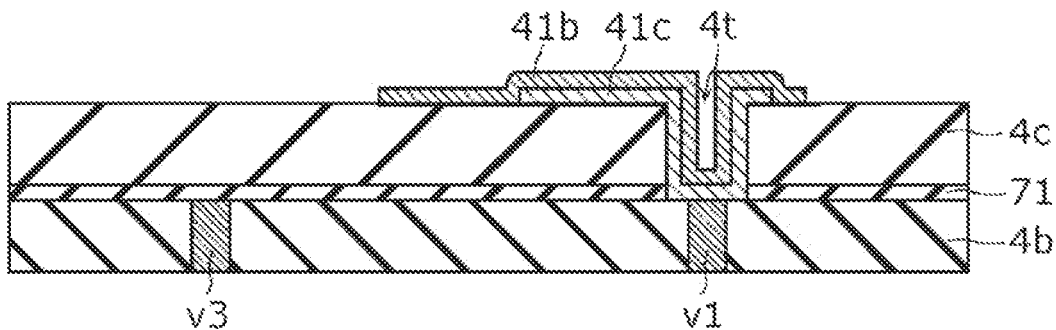
FIG. 6E is a schematic sectional view for describing a formation process for a dielectric layer, the formation process being included in the manufacturing method for the imaging device according to the first embodiment.

Next, as illustrated in FIG. 6E, the dielectric layer 41b is formed. Specifically, first, a dielectric film is deposited on an entire surface of the insulating layer 4c so as to cover the bottom electrode 41c. The dielectric film is, for example, a hafnium oxide film. The hafnium oxide film is formed, for example, by an ALD method or a plasma CVD method. Next, after a resist mask is formed on the deposited dielectric film, for example, a part of the dielectric film is removed by dry etching using chlorine gas, and the resist mask is removed by oxygen ashing processing. As a result, as illustrated in FIG. 6E, the dielectric layer 41b patterned to have a predetermined shape is formed. At this point in time, leaving the dielectric layer 41b larger than the bottom electrode 41c allows the dielectric layer 41b to entirely cover the bottom electrode 41c so that an end portion of the bottom electrode 41c is not exposed.

Figure 6F:
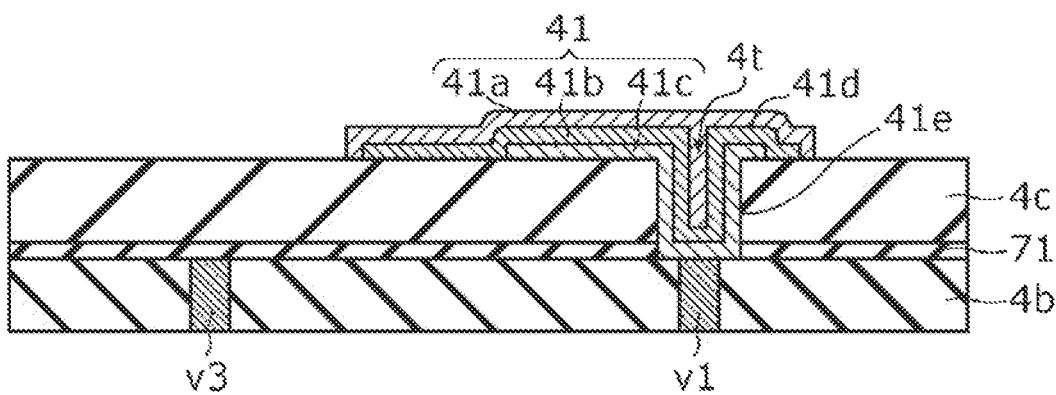
FIG. 6F is a schematic sectional view for describing a formation process for a top electrode, the formation process being included in the manufacturing method for the imaging device according to the first embodiment.

Next, as illustrated in FIG. 6F, the top electrode 41a is formed. Specifically, first, an electrically conductive thin film, such as a titanium nitride film, is deposited on an entire surface of the insulating layer 4c so as to cover the dielectric layer 41b. The titanium nitride film is formed, for example, by an ALD method or a plasma CVD method. Next, after a resist mask is formed on the deposited electrically conductive thin film, for example, a part of the electrically conductive thin film is removed by dry etching using chlorine gas. As a result, as illustrated in FIG. 6F, the top electrode 41a patterned to have a predetermined shape is formed. At this point in time, leaving the top electrode 41a larger than the dielectric layer 41b allows the top electrode 41a to entirely cover the dielectric layer 41b so that an end portion of the dielectric layer 41b is not exposed.

After the bottom electrode 41c is formed, the dielectric film and the electrically conductive thin film may be deposited continuously. After the dielectric film and the electrically conductive thin film are deposited continuously, the electrically conductive thin film, and the dielectric film may be sequentially patterned to thereby form the top electrode 41a and the dielectric layer 41b having predetermined shapes. In this case, an end portion of the top electrode 41a and an end portion of the dielectric layer 41b are generally flush with each other, so that the plan-view shape of the top electrode 41a and the plan-view shape of the dielectric layer 41b become generally the same.

Through the above-described processes, the first capacitive element 41 including the planar portion 41d and the trench portion 41e is formed.

Figure 6G:
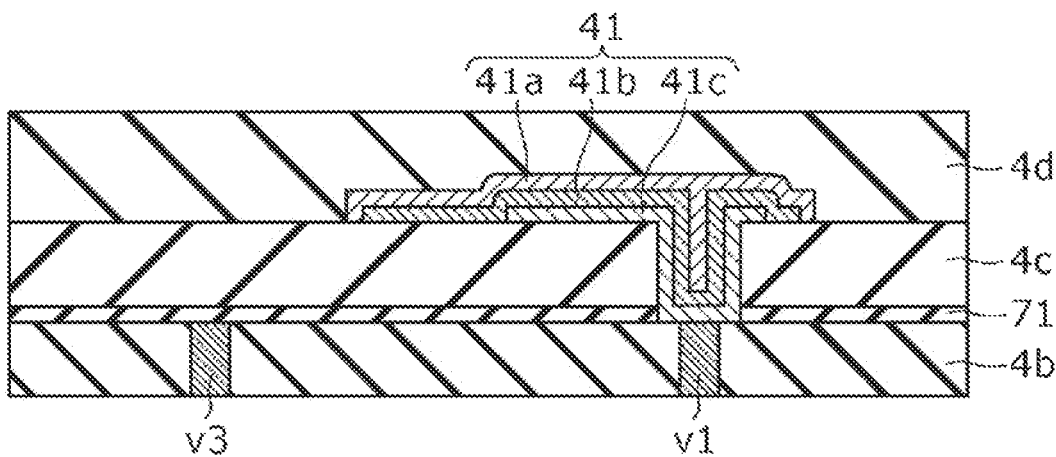
FIG. 6G is a schematic sectional view for describing a formation process for an insulating layer, the formation process being included in the manufacturing method for the imaging device according to the first embodiment.

Next, as illustrated in FIG. 6G, the insulating layer 4d is deposited on an entire surface so as to cover the top electrode 41a of the first capacitive element 41. The insulating layer 4d is, for example, a silicon oxide film.

Figure 6H:
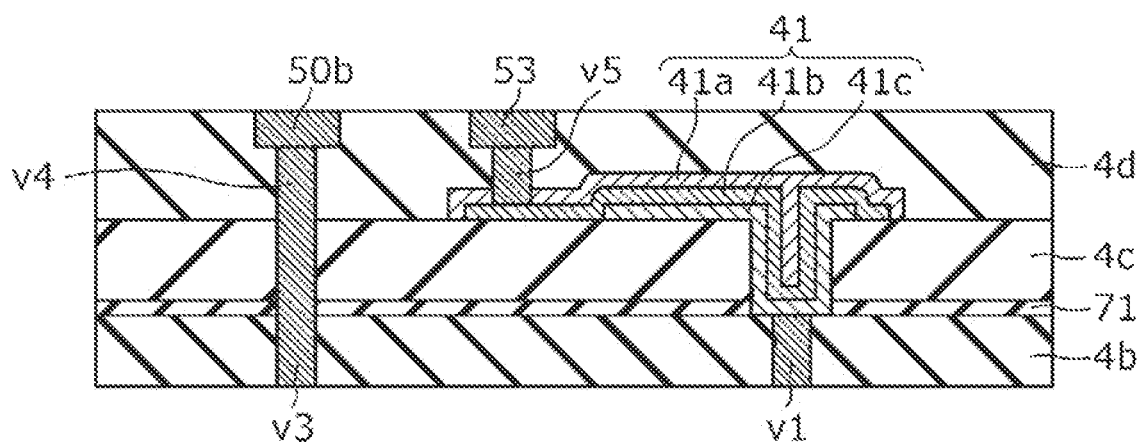
FIG. 6H is a schematic sectional view for describing a formation process for vias and wiring layers, the formation process being included in the manufacturing method for the imaging device according to the first embodiment.

Next, as illustrated in FIG. 6H, vias v4 and v5, the wiring layer 50b, and a wiring layer 53 are formed. The formation of the vias v4 and v5 is performed in the same manner as the vies v1 and v3. That is, after contact holes are formed by photolithography and etching, the formed contact holes are filled with metal material to thereby form the vies v4 and v5.

The via v4 is a part of the via 50d included in the connection portion 50. Although not illustrated in FIG. 3, the via v5 and the wiring layer 53 are portions that provide electrical connection between the top electrode 41a of the first capacitive element 41 and the sensitivity adjustment line 32. In FIG. 6H, although the via v5 is provided so as to penetrate the top electrode 41a, the via v5 may be in contact with an upper surface of the top electrode 41a.

Figure 6I:
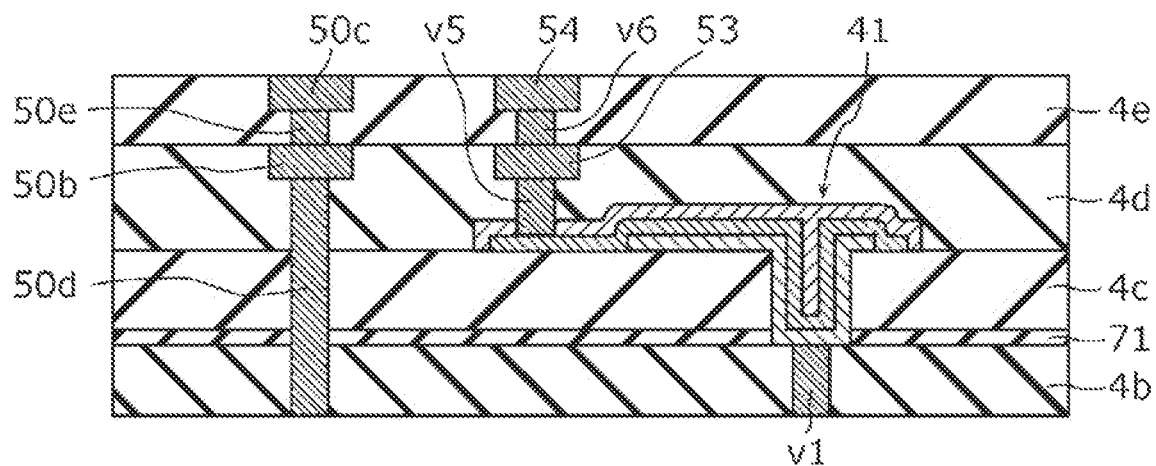
FIG. 6I is a schematic sectional view for describing a formation process for an insulating layer, vias, and wiring layers, the formation process being included in the manufacturing method for the imaging device according to the first embodiment.

In addition, the insulating layer 4e is formed, and the via 50e, a via v6, the wiring layer 50c, and a wiring layer 54 are formed, as illustrated in FIG. 6I, Specific formation methods are analogous to the formation method of the insulating layer 4d and the formation method of the vias v4 and v5 and the wiring layers 50b and 53.

Repeating the formation of the insulating layer, the vias, and the wiring layer makes it possible to form the interlayer insulating layer 4 having a desired number of laminated layers. This allows various signal lines including the sensitivity adjustment lines 32 to be drawn out of the pixel region.

[4. Modification]

Now, a modification of the first embodiment will be described with reference to FIG. 7.

Figure 7:
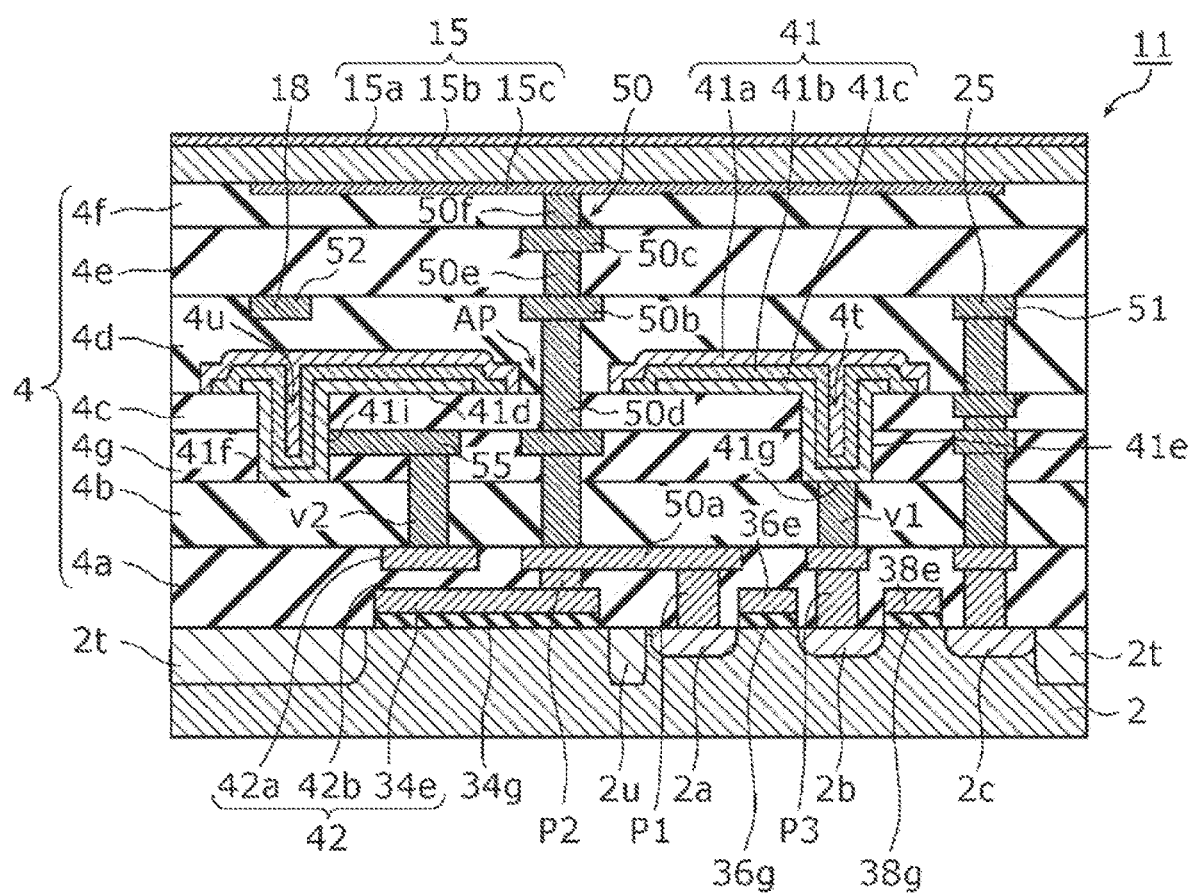
FIG. 7 is a schematic sectional view of each pixel included in an imaging device according to a modification of the first embodiment.

FIG. 7 is a schematic sectional view of each pixel 11 included in an imaging device according to this modification. As illustrated in FIG. 7, an electrical contact point 41i is provided at a side surface of the trench portion 41f in the first capacitive element 41. Specifically, the bottom electrode 41c of the first capacitive element 41 has the electrical contact point 41i. The electrical contact point 41i is a coupling portion of the bottom electrode 41c and a wiring layer 55.

In this modification, the trench portion 41f is provided so as to penetrate the insulating layer 4c and an insulating layer 4g. The insulating layer 4g is located between the insulating layer 4b and the insulating layer 4c. Since the trench portion 41f is provided so as to penetrate the plurality of insulating layers 4c and 4g, the wiring layer 55 can be provided between the insulating layer 4c and the insulating layer 4g. Thus, the contact point 41i can be formed at the side surface of the trench portion 41f.

The number of insulating layers penetrated by the trench portion 41f is not limited to two and may be three or more. This allows a plurality of electrical contact points to be provided at different heights at the side surface of the trench portion 41f.

The wiring layer 55 is electrically connected to an upper end of the via v2. The wiring layer 55 is formed so as to be exposed at a side surface of the trench 4u provided in the insulating layers 4c and 4g. Thus, forming the bottom electrode 41c along the side surface of the trench 4u allows the wiring layer 55 and the bottom electrode 41c to be electrically connected to each other. The first capacitive element 41 is connected to the electrode 42a of the second capacitive element 42 through the electrical the contact point 41i of the bottom electrode 41c, the wiring layer 55, and the via v2.

As described above, the electrical contact point of the bottom electrode 41O of the first capacitive element 41 does not necessarily have to be provided at a bottom portion of the trench portion 41f and may be provided at the side surface of the trench portion 41f. Also, an electrical contact point of the bottom electrode 41c may be provided at the planar portion 41d of the first capacitive element 41.

Second Embodiment

Subsequently, a second embodiment will be described.

Compared with the imaging device according to the first embodiment, an imaging device according to the second embodiment differs in the number of trench portions included in a first capacitive element. Hereinafter, points that differ from the first embodiment will be mainly described, and descriptions of common points will be omitted or briefly given.

Figure 8:
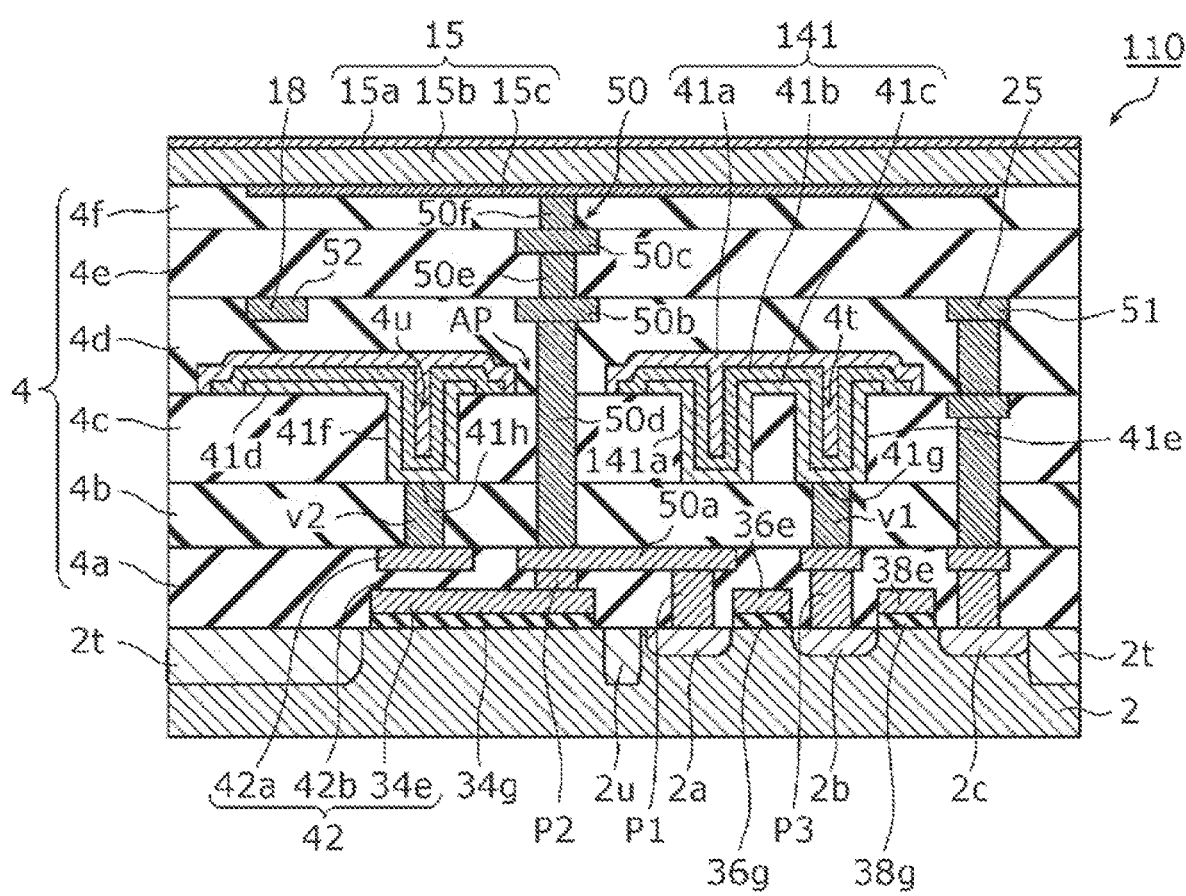
FIG. 8 is a schematic sectional view of each pixel included in an imaging device according to a second embodiment.
Figure 9:
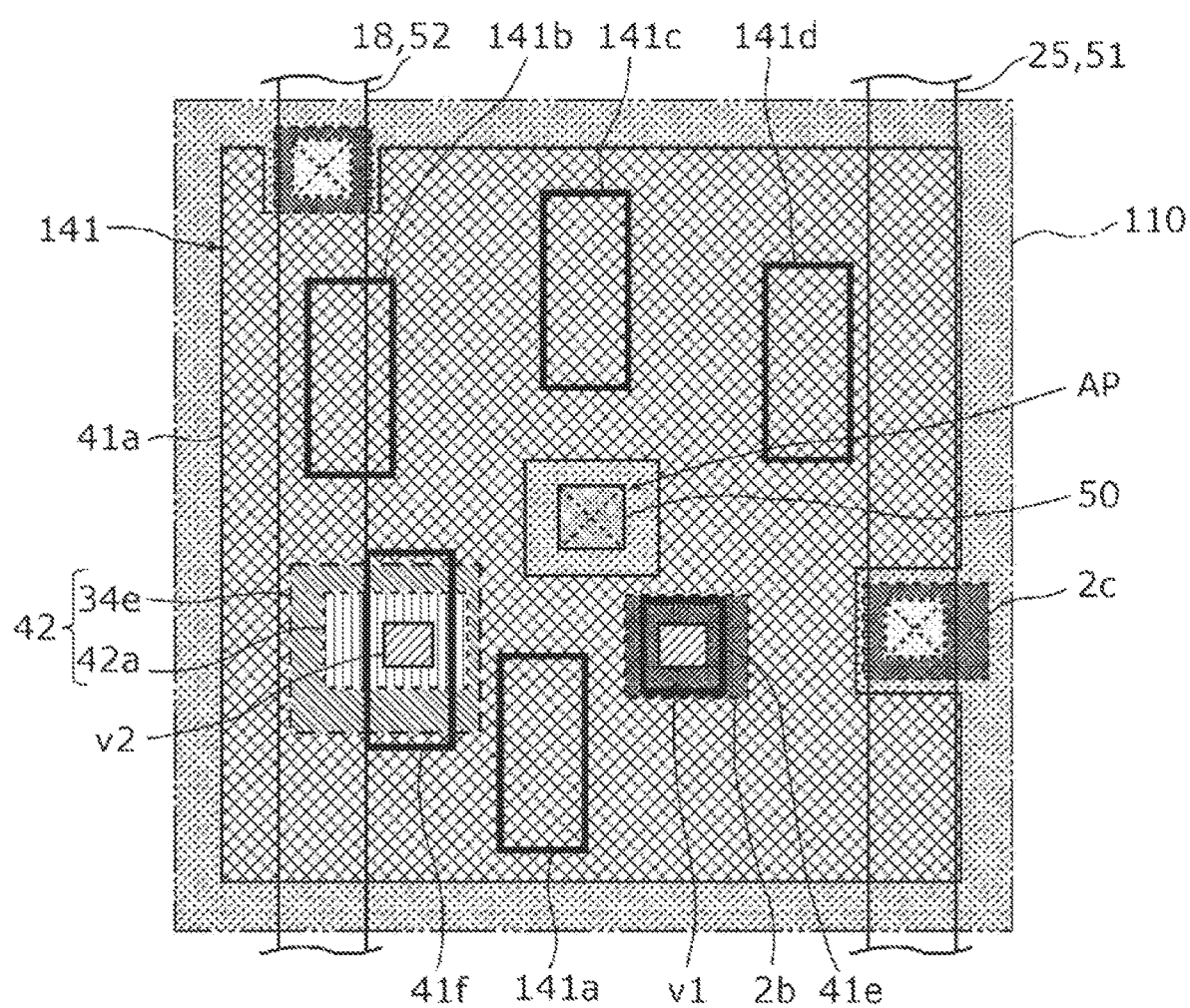
FIG. 9 is a schematic plan view showing one example of the shapes and the arrangements of a first capacitive element and trench portions included in each pixel included in the imaging device according to the second embodiment.

FIG. 8 is a schematic sectional view of each pixel 110 included in the imaging device according to the present embodiment. FIG. 9 is a schematic plan view showing one example of the shapes and the arrangements of a first capacitive element 141 and trench portions included in each pixel 110 included in the imaging device according to the present embodiment.

Compared with the pixel 10 according to the first embodiment, the pixel 110 differs in that it includes the first capacitive element 141 instead of the first capacitive element 41, as illustrated in FIG. 8. The first capacitive element 141 includes three or more trench portions. Specifically, as illustrated in FIG. 9, the first capacitive element 141 includes six trench portions 41e, 41f, 141a, 141b, 141c, and 141d.

As illustrated in FIG. 8, the trench portions 41e and 41f are provided with electrical contact points 41g and 41h, as in the first embodiment. The trench portions 141a, 141b, 141c, and 141d are not provided with electrical contact points. A bottom surface and a side surface of the trench portion 141a are respectively in contact with the insulating layers 4b and 4c and are covered thereby. As illustrated in FIG. 9, a vias that overlaps the trench portion 141a in plan view is not provided. The same also applies to the trench portions 141b, 141c, and 141d.

Thus, in the present embodiment, since the first capacitive element 141 includes a large number of trench portions, the capacitance value can be increased. A specification value of the capacitance value of the first capacitive element 141, in many cases, varies depending on the type of image sensor. For example, when a bright scene is shot, the reset transistor 36 is put into an on state, and not only the charge accumulation node 44 but also the reset drain node 46 can be used as a charge accumulation portion. In this case, the larger the capacitance value of the first capacitive element 141 is, the less likely a gate potential of the signal detection transistor 34 increases, even when a large amount of charge is accumulated. Thus, a conversion gain can be switched, so that an image in which highlight clipping does not occur can be provided even for a bright scene.

The number of trench portions that are not provided with electrical contact points is not limited to four. The number of trench portions that are not provided with electrical contact points may be only one, may be two or three, or may be five or more. Also, the number of trench portions that are provided with electrical contact points is not limited to two, may be only one, or may be three or more.

In the present embodiment, as illustrated in FIGS. 8 and 9, the wiring layers 51 and 52 are provided at an upper side of the first capacitive element 141. As described above, in one example, the wiring layers 51 and 52 include the vertical signal line 18, the feedback line 25, and so on.

In this case, parasitic capacitances occur between the top electrode 41a of the first capacitive element 141 and the wiring layers 51 and 52. In particular, the potentials of the vertical signal line 18 and the feedback line 25 vary with time in accordance with the corresponding pixel 10. Thus, parasitic capacitance components are detected as noise components in the vertical signal line 18 and the feedback line 25.

Figure 10:
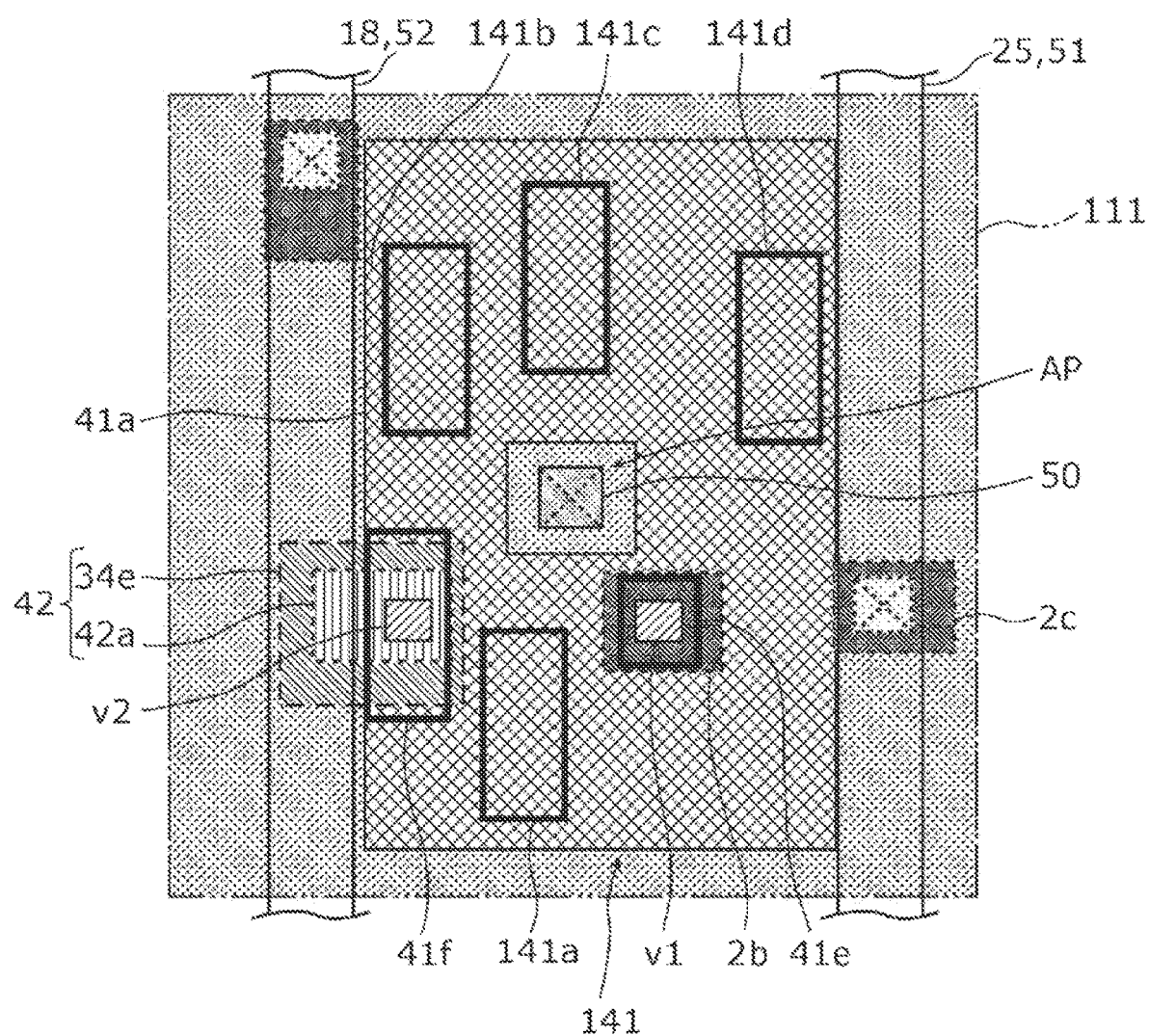
FIG. 10 is a schematic plan view showing one example of the shapes and the arrangements of a first capacitive element and trench portions included in each pixel included in an imaging device according to a modification of the second embodiment.

A parasitic capacitance value is proportional to a dielectric constant of an insulating film between the wiring layers 51 and 52 and the top electrode 41a and to a difference voltage that occurs therebetween. In contrast, in order to reduce the parasitic capacitance value, the top electrode 41a of the first capacitive element 141 and the wiring layers 51 and 52 may be arranged so as not to overlap each other, as illustrated in FIG. 10. This makes it possible to suppress noise components based on the parasitic capacitance. FIG. 10 is a schematic plan view showing one example of the shapes and the arrangements of the first capacitive element 141 and trench portions included in each pixel 111 included in an imaging device according to a modification of the second embodiment.

In this modification, as can be understood from comparison between FIGS. 8 and 10, the area that the first capacitive element 141 occupies in the pixel in plan view is reduced. Thus, the capacitance value of the planar portion 41d of the first capacitive element 141 decreases.

Meanwhile, in order for the first capacitive element 141 to achieve a desired capacitance value, the first capacitive element 141 needs to ensure a certain electrode area in plan view. Ensuring the electrode area and suppressing overlap with the wiring layers are in a trade-off relationship. That is, when the electrode area is increased, it is difficult to avoid overlap with the wiring layers.

In contrast, in the first capacitive element 141 according to this modification, providing the plurality of trench portions 41e, 41f, 141a, 141b, 141c, and 141d while avoiding overlap with the wiring layers in plan view makes it possible to obtain an electrode area by utilizing the sidewalls of the trench portions. This makes it possible to increase the capacitance value of the first capacitive element 141 while suppressing noise components caused by parasitic capacitance.

Third Embodiment

Subsequently, a third embodiment will be described.

In an imaging device according to the third embodiment, the circuit configuration thereof differs from the imaging devices according to the first and second embodiments. Hereinafter, points that differ from the first and second embodiments will be mainly described, and descriptions of common points will be omitted or briefly given.

Figure 11:
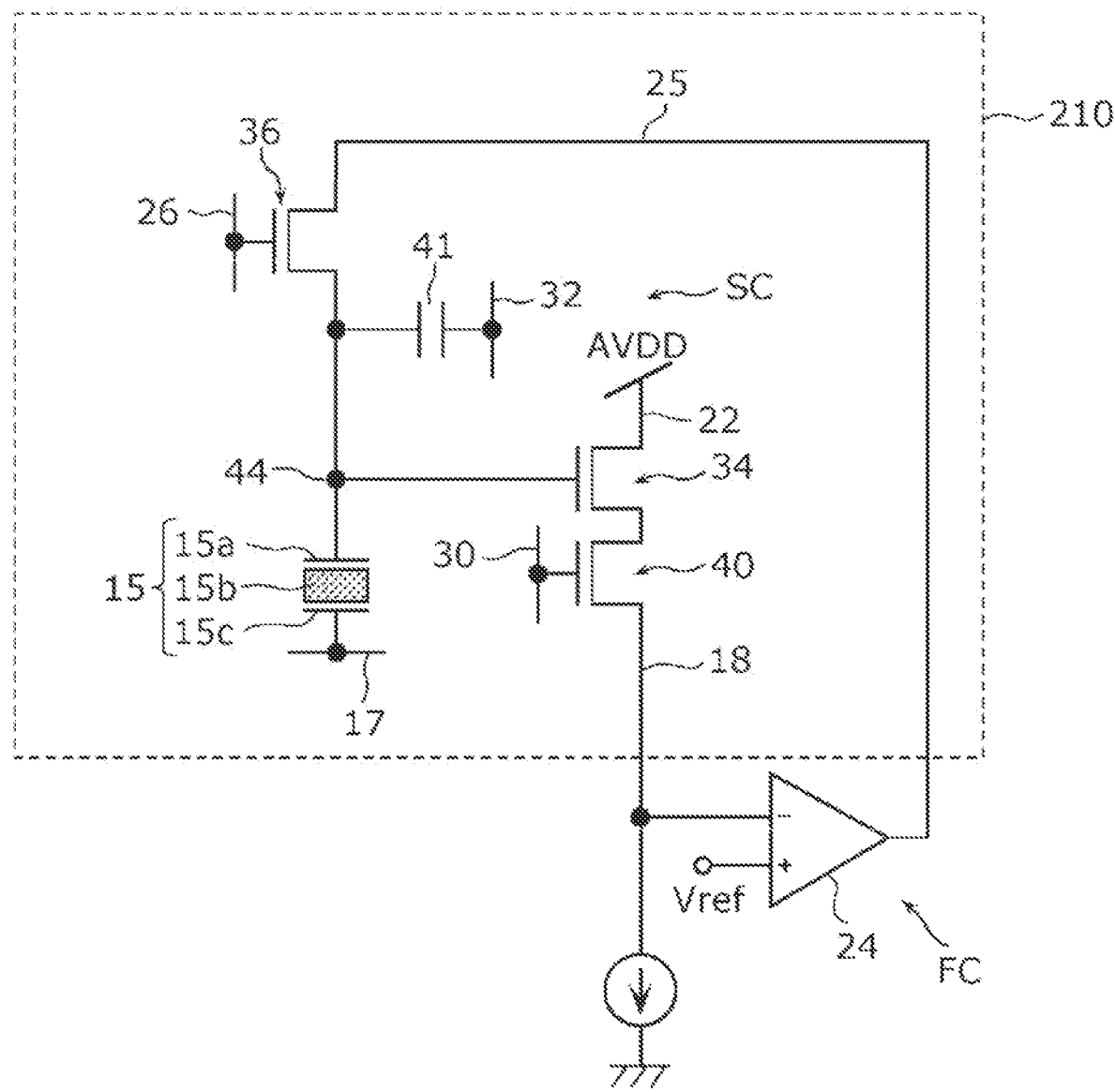
FIG. 11 is a diagram showing one example of a circuit configuration of each pixel included in an imaging device according to a third embodiment.

FIG. 11 is a diagram showing one example of a circuit configuration of each pixel 210 included in the imaging device according to the present embodiment. As illustrated in FIG. 11, compared with the pixel 10 according to the first embodiment, the pixel 210 differs in that it does not include the second capacitive element 42 and the feedback transistor 38. In the pixel 210, the reset drain node 46 is not provided. Also, in the pixel 210, the reset transistor 36 is provided between one of a pair of electrodes of the first capacitive element 41 and the feedback line 25. That is, the reset transistor 36 is provided at the same position as the feedback transistor 38 according to the first embodiment.

As illustrated in FIG. 11, the charge accumulation node 44 is connected to one of the pair of electrodes of the first capacitive element 41. Thus, the first capacitive element 41 functions as a charge accumulation portion. That is, signal charge generated in the photoelectric converter 15 is also accumulated in the first capacitive element 41. This makes it possible to increase the amount of signal charge accumulated in the pixel 210, thus making it possible to suppress occurrence of highlight clipping even in a bright scene.

Figure 12:
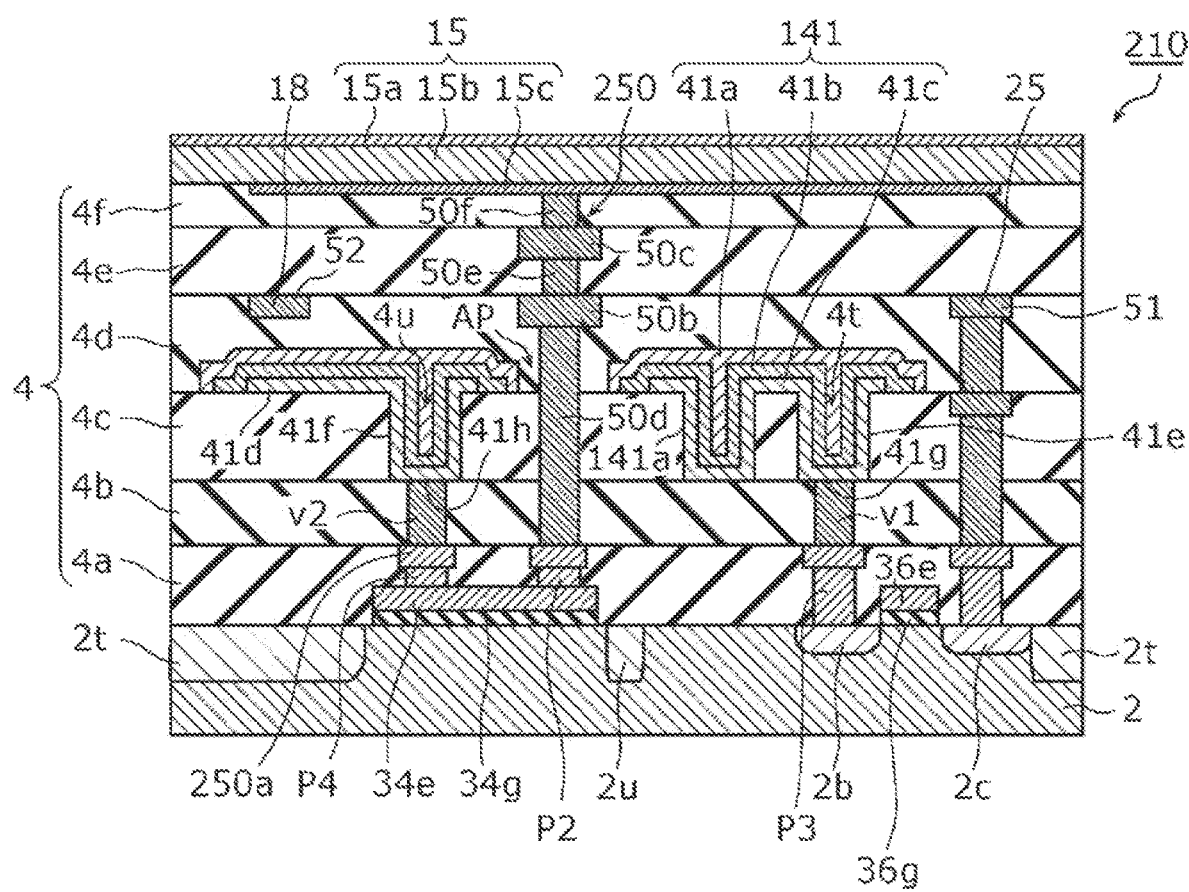
FIG. 12 is a schematic sectional view of each pixel included in the imaging device according to the third embodiment.

FIG. 12 is a schematic sectional view of the pixel 210 included in the imaging device according to the present embodiment. As illustrated in FIG. 12, the reset transistor 36, instead of the feedback transistor 38 illustrated in FIG. 3, is provided at the same position as the feedback transistor 38. That is, the impurity region 2b is one of a source region and a drain region of the reset transistor 36. The impurity region 2c is the other of the source region and the drain region of the reset transistor 36.

Also, as illustrated in FIG. 12, the pixel 210 includes a connection portion 250 instead of the connection portion 50. The connection portion 250 does not include the plug P1 and the wiring portion 50a illustrated in FIG. 3. The connection portion 250 provides electrical connection between the second electrode 15c of the photoelectric converter 15 and the gate electrode 34e of the signal detection transistor 34.

The gate electrode 34e is connected to the via v2 through a plug P4 and a wiring portion 250a. The via v2 is connected to the bottom electrode 41c of the first capacitive element 41, as in the first embodiment. With this configuration, as illustrated in FIG. 12, the second electrode 15c of the photoelectric converter 15 is connected to the impurity region 2b through the connection portion 250, the gate electrode 34e, the plug P4, the wiring portion 250a, the via v2, the bottom electrode 41c of the first capacitive element 41, the via v1, and the plug P3. That is, the second electrode 15c, the connection portion 250, the gate electrode 34e, the plug P4, the wiring portion 250a, the via v2, the bottom electrode 41c of the first capacitive element 41, the via v1, the plug P3, and the impurity region 2b serve as the charge accumulation node 44.

As described above, in the present embodiment, since the capacity of the charge accumulation portion in which the signal charge generated by the photoelectric converter 15 is accumulated can be increased, it is possible to suppress occurrence of highlight clipping even in a bright scene.

Fourth Embodiment

Subsequently, a fourth embodiment will be described,

Compared with the imaging device according to each of the first to third embodiments, an imaging device according to the fourth embodiment differs in that an electrical contact point is provided at the top electrode. Hereinafter, points that differ from the first to third embodiments will be mainly described, and descriptions of common points will be omitted or briefly given.

Figure 13:
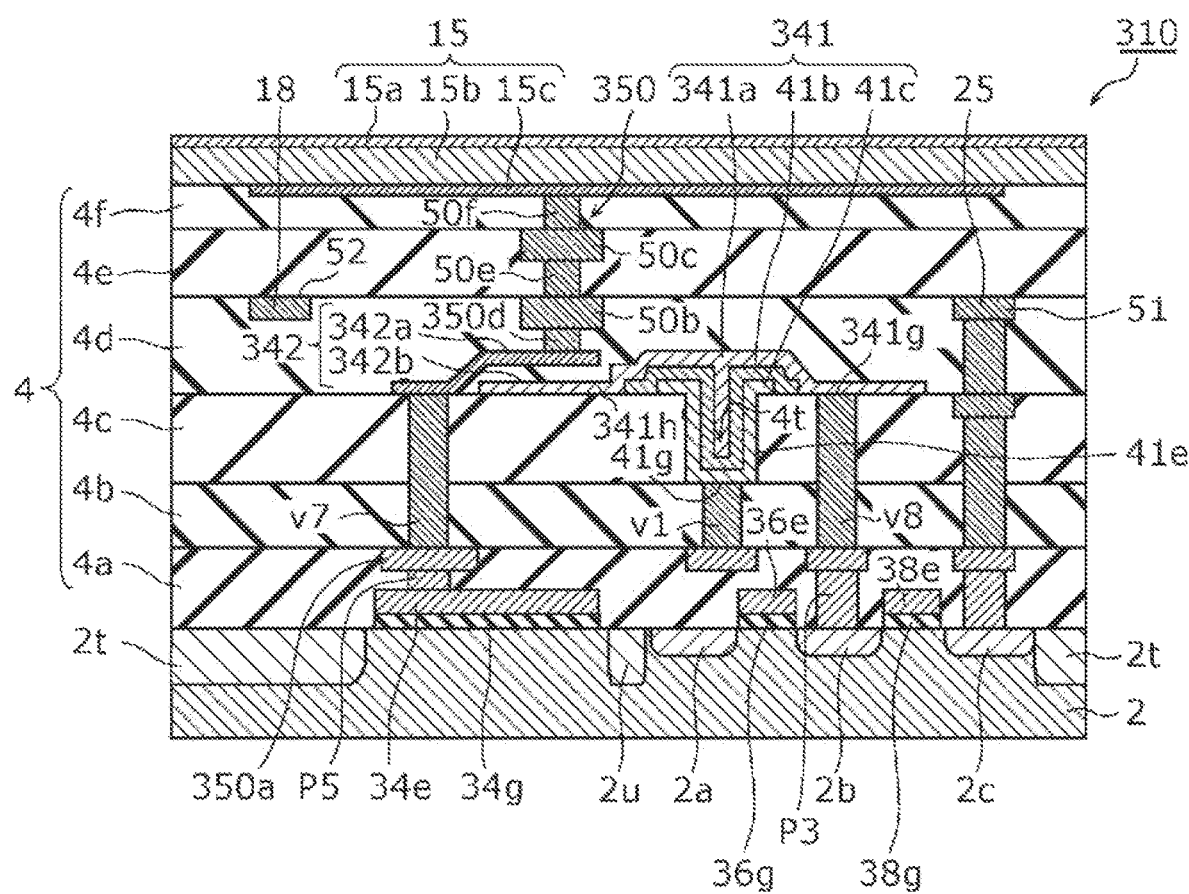
FIG. 13 is a schematic sectional view of each pixel included in an imaging device according to a fourth embodiment.

FIG. 13 is a schematic sectional view of each pixel 310 included in the imaging device according to the present embodiment. As illustrated in FIG. 13, compared with the pixel 10 according to the first embodiment, the pixel 310 includes a connection portion 350 instead of the connection portion 50, The connection portion 350 includes a plug P5, a wiring portion 350a, an electrode 342a, vias v7, 350d, 50e, and 50f, and the wiring layers 50b and 50c. The connection portion 350 provides electrical connection between the second electrode 15c of the photoelectric converter 15 and the gate electrode 34e of the signal detection transistor 34. Also, the gate electrode 34e is electrically connected to the impurity region 2a, the connection of which is not illustrated in FIG. 13.

Also, as illustrated in FIG. 13, the pixel 310 includes a first capacitive element 341 and a second capacitive element 342, instead of the first capacitive element 41 and the second capacitive element 42, compared with the pixel 10 according to the first embodiment, The first capacitive element 341 has a top electrode 341a, the dielectric layer 41b, and the bottom electrode 41c.

The top electrode 341a of the first capacitive element 341 has an electrode portion 342b. The electrode portion 342b is a portion provided so as to extend from the top electrode 341a onto the upper surface of the insulating layer 4c. Specifically, in plan view, the electrode portion 342b overlaps a part of the electrode 342a included in the connection portion 350. Thus, the electrode portion 342b and the part of the electrode 342a form the second capacitive element 342.

Also, the top electrode 341a of the first capacitive element 341 has contact points 341g and 341h. The contact points 341g and 341h are provided at portions that are included in the top electrode 341a and that extend onto the insulating layer 4c.

The contact point 341g is provided at a bottom surface of the top electrode 341a. The contact point 341g is connected to a via v8 and is connected to the impurity region 2b through the via v8 and the plug P3. That is, the contact point 341g is connected to the reset transistor 36 and the feedback transistor 38. In the present embodiment, each of the reset transistor 36 and the feedback transistor 38 is one example of an electrical element to which the contact point 341g is electrically connected, as in the first embodiment.

The contact point 341h is a connection portion of the top electrode 341a and the electrode portion 342b. That is, the contact point 341h is connected to the second capacitive element 342. In the present embodiment, the second capacitive element 342 is one example of an electrical element to which the contact point 341h is electrically connected.

In the example illustrated in FIG. 13, the bottom electrode 41c is also provided with the contact point 41g. The contact point 41g is connected to the via v1. Although not illustrated in FIG. 13, the contact point 41g is connected to the sensitivity adjustment line 32 through the via v1.

As described above, in the imaging device according to the present embodiment, two contact points 341g and 341h are provided at the top electrode 341a of the first capacitive element 341. Also, the contact points 341g and 341h are provided at portions other than the trench portion 41e in the first capacitive element 341. Also, the contact points 341g and 341h may be provided at an upper surface of the top electrode 341a. That is, the via provided on the first capacitive element 341 and the top electrode 341a may be electrically connected to each other.

Also, at least one contact point may be provided at the top electrode 341a of the trench portion 41e. For example, although, in FIG. 13, the top electrode 341a is provided so as to fill the trench 4t, the top electrode 341a may also be configured with a uniform film thickness in the trench 4t and may have a shape that is curved along a bottom surface and a side surface of the trench 4t, similarly to the dielectric layer 41b and the bottom electrode 41c. In this case, a contact point may be provided at an inner bottom surface of the top electrode 341a in the trench portion 41e. Alternatively, the contact point may be provided at an inner side surface of the top electrode 341a in the trench portion 41e.

Fifth Embodiment

Subsequently, a fifth embodiment will be described.

Compared with the imaging device according to each of the first to fourth embodiments, an imaging device according to the fifth embodiment differs in that the photoelectric converter is provided in the semiconductor substrate. Hereinafter, points that differ from the first to fourth embodiments will be mainly described, and descriptions of common points will be omitted or briefly given.

Figure 14:
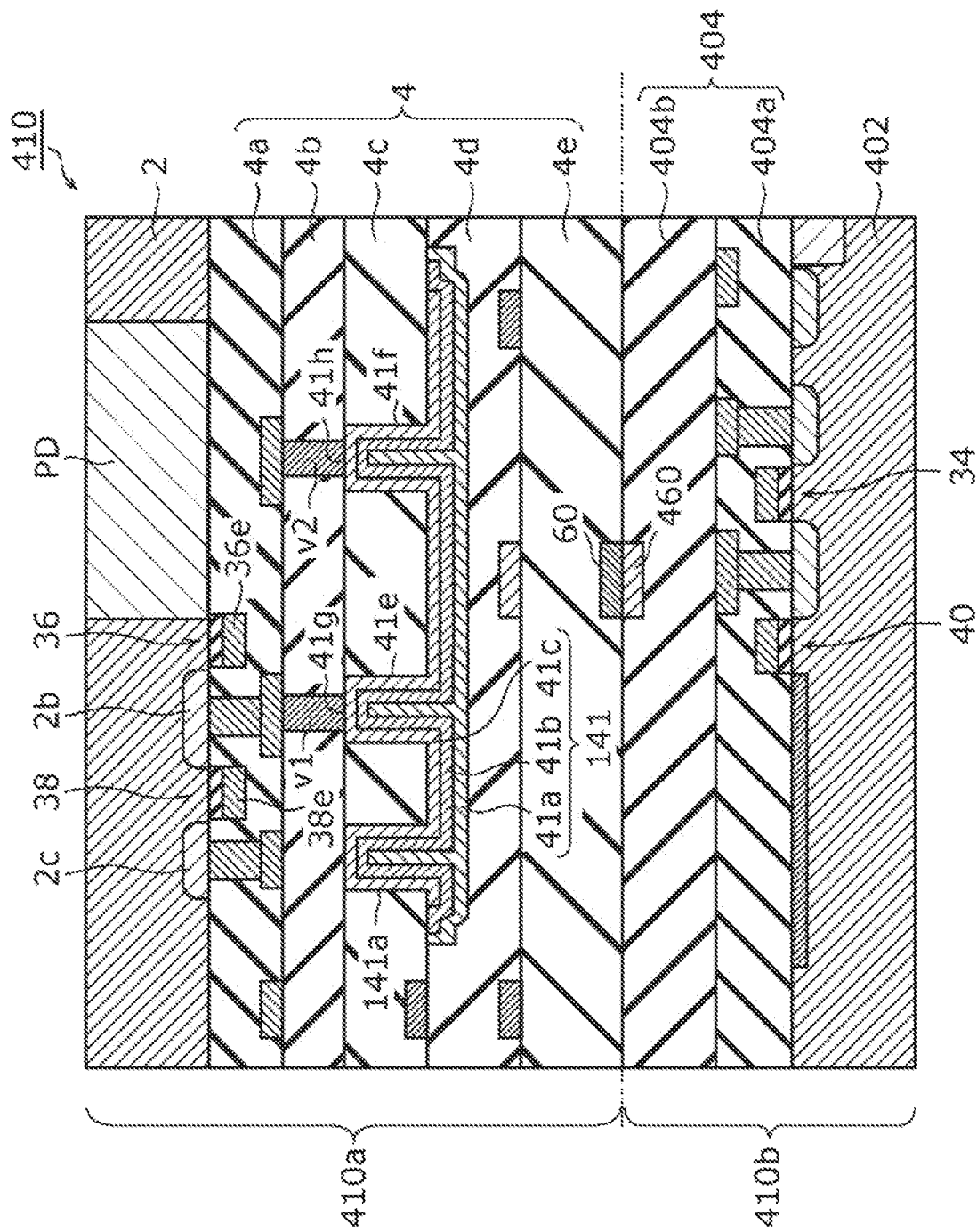
FIG. 14 is a schematic sectional view of each pixel included in an imaging device according to a fifth embodiment.

FIG. 14 is a schematic sectional view of each pixel 410 included in the imaging device according to the present embodiment.

As illustrated in FIG. 14, the pixel 410 includes a photodiode PD instead of the photoelectric converter 15. The photodiode PD is one example of a photoelectric converter and is, for example, a photodiode having a P-N junction. The photodiode PD is formed by an impurity region or the like formed in the semiconductor substrate 2.

The imaging device according to the present embodiment is a backside-illuminated CMOS image sensor. The "backside" refers to one of two major surfaces of the semiconductor substrate 2 and is a surface opposite to the major surface at which the interlayer insulating layer 4 is provided. In the imaging device according to the present embodiment, light is incident from the backside of the semiconductor substrate 2, that is, from an upper side in the plane of FIG. 14.

Also, the imaging device according to the present embodiment has a chip-stack structure. Specifically, the imaging device includes a first chip 410a and a second chip 410b. The first chip 410a and the second chip 410b are arranged one on another, that is, are stacked, in vertical directions.

As illustrated in FIG. 14, the first chip 410a includes the semiconductor substrate 2 and the interlayer insulating layer 4. The second chip 410b includes a semiconductor substrate 402 and an interlayer insulating layer 404. After the first chip 410a and the second chip 410b are respectively manufactured, they are arranged one on another to thereby form the imaging device including the pixels 410. Specifically, the interlayer insulating layer 4 formed on a major surface of the semiconductor substrate 2 and the interlayer insulating layer 404 formed on the major surface of the semiconductor substrate 402 are bonded to each other. In FIG. 14, the bonding plane is schematically denoted by a dashed-and-dotted line. In the present embodiment, the interlayer insulating layer 4 includes five insulating layers 4a, 4b, 4c, 4d, and 4e. The interlayer insulating layer 404 includes two insulating layers 404a and 404b. The numbers of layers in the interlayer insulating layer 4 and the interlayer insulating layer 404 are not limited to those numbers.

In the example illustrated in FIG. 14, the first chip 410a is provided with the reset transistor 36, the feedback transistor 38, and the first capacitive element 141. The second chip 410b is provided with the signal detection transistor 34 and the address transistor 40. The second capacitive element 42 may be provided in the interlayer insulating layer 4 or may be provided in the interlayer insulating layer 404. The elements included in the signal detection circuit SC in the pixel 410 may be provided in any of the first chip 410a and the second chip 410b.

As illustrated in FIG. 14, the insulating layer 4e, which is the uppermost layer (the layer at a lower side in the plane of the figure) in the interlayer insulating layer 4, is provided with an electrically conductive terminal portion 60. Similarly, the insulating layer 404b, which is the uppermost layer in the interlayer insulating layer 404, is provided with an electrically conductive terminal portion 460. Since the terminal portion 60 and the terminal portion 460 are connected in contact with each other, the elements provided at the semiconductor substrate 2 and the elements provided at the semiconductor substrate 402 can be electrically connected to each other.

In the present embodiment, the contact point 41g is provided at the bottom surface of the trench portion 41e in the first capacitive element 141. The contact point 41g is connected to the reset transistor 36 through the via v1.

Also, the contact point 41h is provided at the bottom surface of the trench portion 41f in the first capacitive element 141. Although not illustrated in FIG. 14, the contact point 41h is electrically connected to the second capacitive element 42. The second capacitive element 42 is provided, for example, in the first chip 410a. As described above, two or more electrical elements to which two or more electrical contact points of the first capacitive element 141 are connected are provided in the first chip 410a in which the first capacitive element 141 is provided.

The two or more electrical elements to which the two or more electrical contact points of the first capacitive element 141 are connected do not necessarily have to be provided in the first chip 410a. At least one electrical element or all electrical elements may be connected to the second chip 410b.

Figure 15:
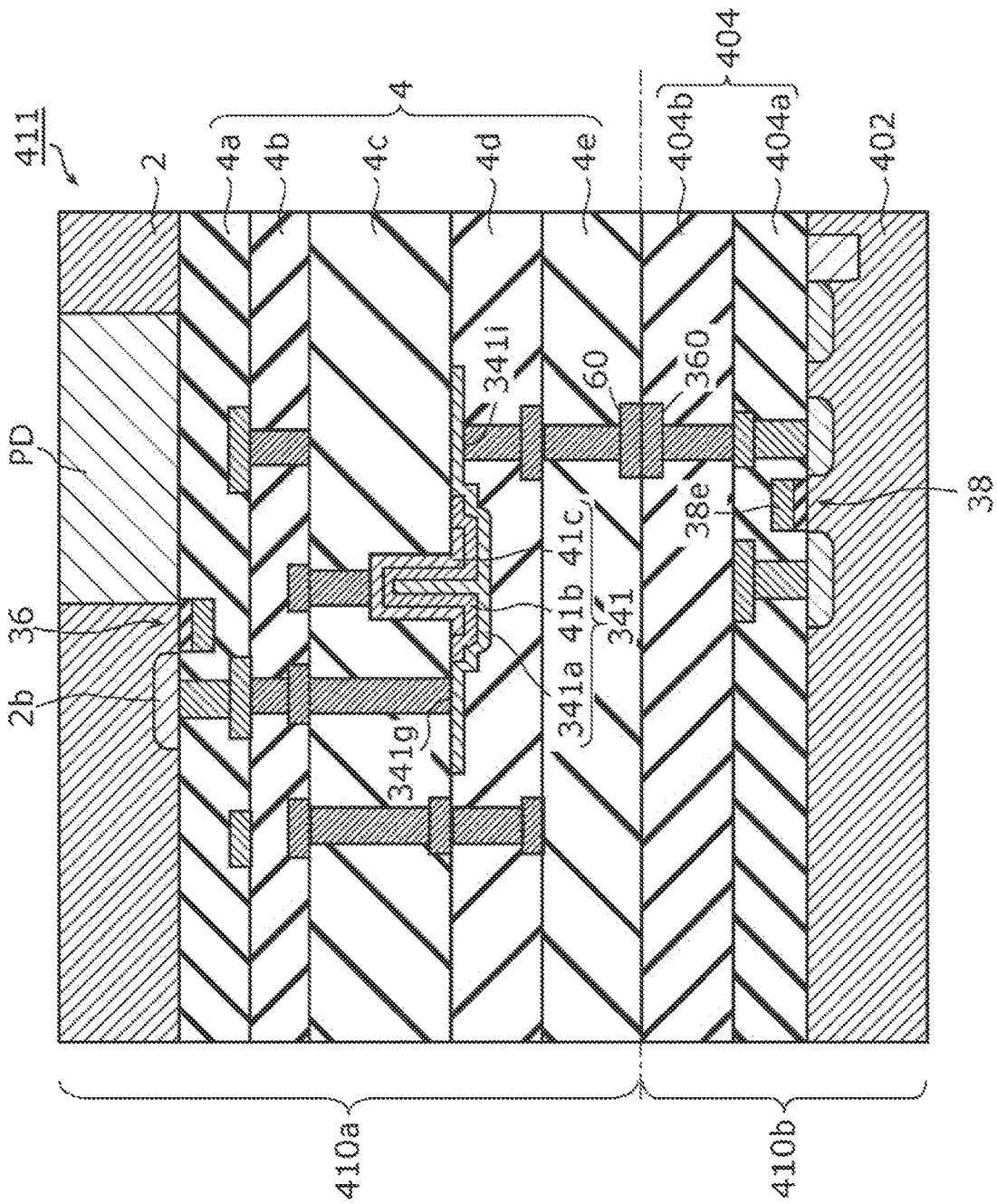
FIG. 15 is a schematic sectional view of each pixel included in an imaging device according to a modification of the fifth embodiment.

FIG. 15 is a schematic sectional view of each pixel 411 included in the imaging device according to this modification. In the pixel 411 illustrated in FIG. 15, the reset transistor 36 and the first capacitive element 341 are provided in the first chip 410a. The feedback transistor 38 is provided in the second chip 410b. The signal detection transistor 34, the address transistor 40, and the second capacitive element 42 may be provided in the first chip 410a or may be provided in the second chip 410b.

As illustrated in FIG. 15, the pixel 411 includes the first capacitive element 341. The top electrode 341a of the first capacitive element 341 includes the contact points 341g and 341i. The contact point 341g is electrically connected to the reset transistor 36. That is, the reset transistor 36 is one example of an electrical element. The contact point 341i is electrically connected to the feedback transistor 38. That is, the feedback transistor 38 is one example of an electrical element.

Two or more electrical elements to which two or more contact points of the first capacitive element 341 are connected may be respectively provided in the first chip 410a and the second chip 410b. That is, the first chip 410a and the second chip 410b may be stacked to thereby cause the contact points and the electrical elements to be electrically connected to each other.

Other Embodiments

Although the imaging devices according to one or more aspects have been described based on the embodiments, the present disclosure is not limited to those embodiments. Modes obtained by making various modifications conceived by those skilled in the art to the embodiments and modes constructed by combining the constituent elements in different embodiments are also encompassed by the scope of the present disclosure, as long as such modes do not depart from the spirit of the present disclosure.

Figure 16:
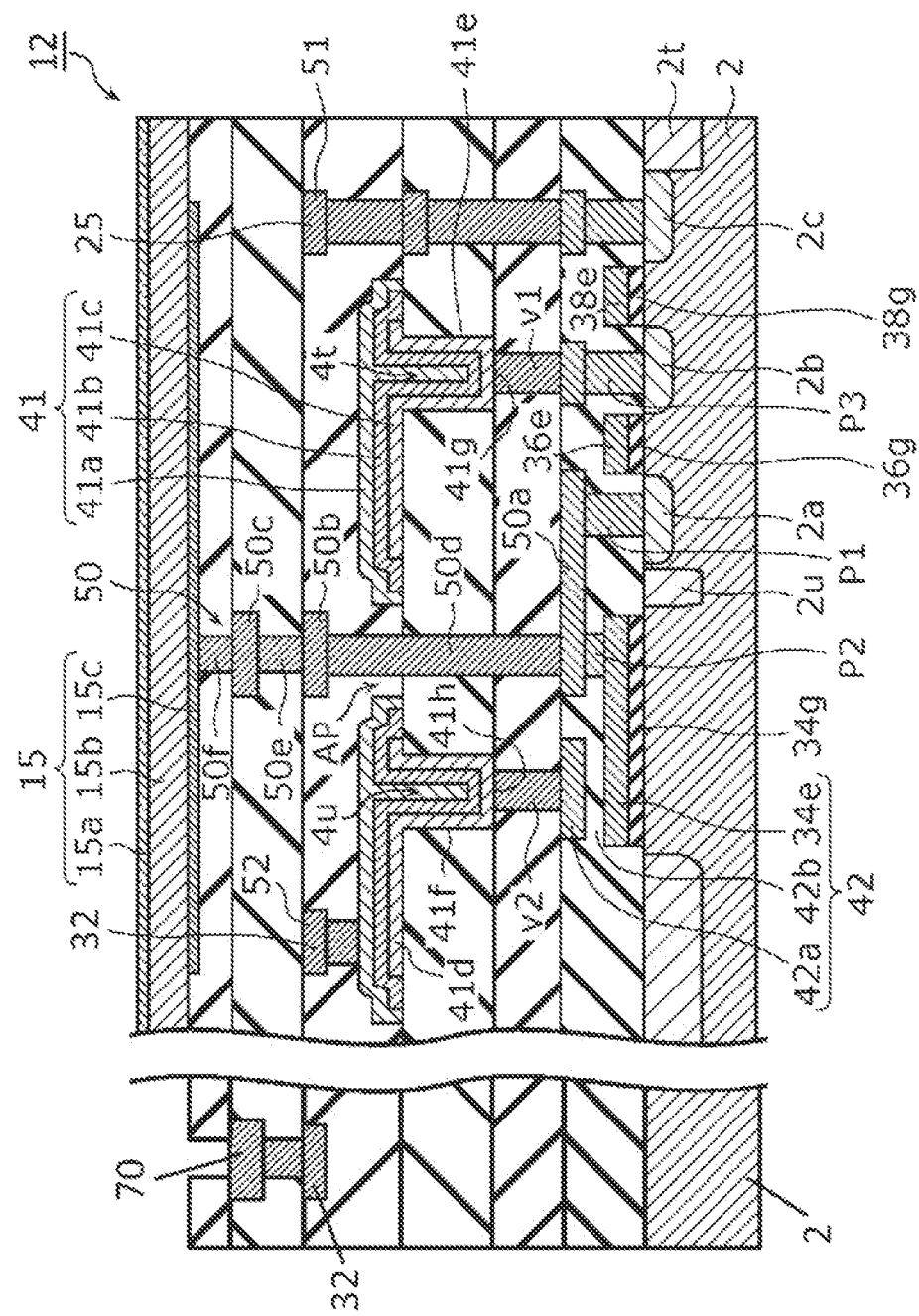
FIG. 16 is a schematic sectional view of each pixel included in an imaging device according to another modification of the first embodiment.

FIG. 16 is a schematic sectional view of each pixel 12 included in an imaging device according to another modification of the first embodiment. As illustrated in FIG. 16, in the pixel 12, the top electrode 41a of the first capacitive element 41 is electrically connected to the sensitivity adjustment line 32 through a via. The sensitivity adjustment line 32 extends from inside of the pixel region to outside of the pixel region. In a region outside the pixel region, the sensitivity adjustment line 32 is electrically connected to a pad 70 through a via. Accordingly, the top electrode 41a is electrically connected to the pad 70 through the sensitivity adjustment line 32.

For example, in the embodiments described above, the numbers of insulating layers and wiring layers included in the interlayer insulating layer in the imaging device are not particularly limited. Also, the position of the capacitive element in the interlayer insulating layer is not particularly limited.

For example, the number of trench portions included in the first capacitive element may be only one. No electrical contact point may be provided in any of the trench portion included in the first capacitive element. In this case, two or more electrical contact points may be provided at the top electrode at the planar portion of the first capacitive element or may be provided at the bottom electrode at the planar portion. The electrical contact points may be provided at any of the upper surface and the lower surface of the top electrode or the bottom electrode.

For example, the dielectric layer 41b may be an insulating film, such as a silicon oxide film or a silicon nitride film, not a thin film using a high-k material.

For example, each transistor included in the signal detection circuit SC in the imaging device may be a P-channel MOSFET. Also, each transistor may be a bipolar transistor, not an FET.

Also, various changes, replacements, additions, omissions, and so on within the scope recited in the claims and a scope equivalent thereto can be made to each embodiment described above, The imaging device according to one aspect of the present disclosure is useful for, for example, image sensors and digital cameras. For example, the imaging device according to one aspect of the present disclosure can be used for medical cameras, cameras for robots, security cameras, camera mounted on vehicles, and so on.

What is claimed is:

1. An imaging device comprising:
   a semiconductor substrate; and
   pixels, wherein:
   each of the pixels includes a first capacitive element including
   a first electrode provided above the semiconductor substrate,
   a second electrode provided above the semiconductor substrate, and
   a dielectric layer located between the first electrode and the second electrode,
   at least one selected from the group consisting of the first electrode and the second electrode has a first electrical contact point electrically connected to a first electrical element and a second electrical contact point electrically connected to a second electrical element different from the first electrical element,
   the first capacitive element includes a first trench portion and a second trench portion, each having a trench shape,
   the first electrical contact point is provided at the first trench portion, and
   the second electrical contact point is provided at the second trench portion.

2. The imaging device according to claim 1, wherein the first electrical contact point is provided at a bottom surface of the first trench portion, or the second electrical contact point is provided at a bottom surface of the second trench portion.

3. The imaging device according to claim 1, wherein the first capacitive element further includes a third trench portion.

4. The imaging device according to claim 1, wherein the first electrode is closer to the semiconductor substrate than the second electrode is, and
   the first electrode has the first electrical contact point and the second electrical contact point.

5. The imaging device according to claim 1, wherein the second electrode is farther from the semiconductor substrate than the first electrode is, and
   the second electrode has the first electrical contact point and the second electrical contact point.

6. The imaging device according to claim 1, wherein the first electrode and the second electrode contain titanium nitride or tantalum nitride.

7. The imaging device according to claim 1, further comprising:
   a plurality of wiring layers provided at an upper side of the semiconductor substrate,
   wherein, of the plurality of wiring layers, the number of wiring layers located at an upper side of the first capacitive element is larger than the number of wiring layers located at a lower side of the first capacitive element.

8. The imaging device according to claim 1, further comprising:
   vias,
   wherein each of the first electrical contact point and the second electrical contact point is connected to a corresponding one of the vias.

9. The imaging device according to claim 1, wherein each of the pixels further includes
   a photoelectric converter that converts light into charge, and
   an impurity region that is provided in the semiconductor substrate, the impurity region being electrically connected to the photoelectric converter,
   the charge is accumulated in the impurity region, and,
   in a plan view, the first capacitive element overlaps all of the impurity region.

10. The imaging device according to claim 1, wherein each of the pixels further includes
    a photoelectric converter that converts light into charge,
    an impurity region that is provided in the semiconductor substrate, the impurity region being electrically connected to the photoelectric converter,
    a transistor electrically connected to the impurity region, and
    a second capacitive element,
    the charge is accumulated in the impurity region,
    the transistor comprises one of the first electrical contact point and the second electrical contact point, and
    the second capacitive element comprises the other of the first electrical contact point and the second electrical contact point.

11. The imaging device according to claim 10, wherein the transistor is a reset transistor that resets the charge.

12. The imaging device according to claim 10, wherein the second capacitive element is electrically connected to the impurity region via the first electrode or the second electrode.

13. The imaging device according to claim 1, wherein each of the pixels further includes
    a photoelectric converter that converts light into charge, and an impurity region that is provided in the semiconductor substrate, the impurity region being electrically connected to the photoelectric converter, the charge is accumulated in the impurity region, the first electrode is closer to the semiconductor substrate than the second electrode is, the first electrode is electrically connected to the impurity region, and the second electrode is electrically connected to a pad to which a predetermined voltage value is applied.

14. The imaging device according to claim 13, further comprising:

a sensitivity adjustment line for adjusting sensitivity of the imaging device, the sensitivity adjustment line being electrically connected to the pad and the second electrode.

15. The imaging device according to claim 1, further comprising:

a signal line that is connected to the pixels, wherein:

a potential of the signal line varies with time, each of the pixels further includes an impurity region that is provided in the semiconductor substrate, charge generated by photoelectric conversion is accumulated in the impurity region, and one of the first trench portion or the second trench portion is located between the impurity region and the signal line and on a line that connects the impurity region and at least a part of the signal line.

16. The imaging device according to claim 1, further comprising:

a signal line that is connected to the pixels, wherein:

a potential of the signal line varies with time, each of the pixels further includes a photoelectric converter that converts light into charge, a first via that connects the semiconductor substrate and the photoelectric converter, and a second via that connects the signal line and the semiconductor substrate, and one of the first trench portion and the second trench portion is located between the first via and the second via and on a line that connects the first via and the second via.

17. The imaging device according to claim 1, further comprising:

a signal line that is connected to the pixels, wherein a potential of the signal line varies with time, each of the pixels further includes a second via that connects the signal line and the semiconductor substrate, and in a plan view, the first capacitive element does not overlap the second via.

18. The imaging device according to claim 1, wherein:

each of the pixels further includes a photoelectric converter that converts light into charge, and a first via that connects the semiconductor substrate and the photoelectric converter, and in a sectional view, the first via is located between the first trench portion and the second trench portion.

* * * * *